United States Patent [19]
Plaisted

[11] Patent Number: 6,131,078
[45] Date of Patent: Oct. 10, 2000

[54] METHOD FOR DESIGN VERIFICATION OF HARDWARE AND NON-HARDWARE SYSTEMS

[76] Inventor: David A. Plaisted, 5616 Hideaway Dr., Chapel Hill, N.C. 27516

[21] Appl. No.: 09/339,091

[22] Filed: Jun. 23, 1999

Related U.S. Application Data

[63] Continuation-in-part of application No. 09/306,136, May 6, 1999, abandoned.

[51] Int. Cl.[7] .................................................. G06F 17/10
[52] U.S. Cl. ................................................... 703/2; 716/5
[58] Field of Search ............................... 703/2; 716/5, 2, 716/4

[56] References Cited

U.S. PATENT DOCUMENTS

| | | | |
|---|---|---|---|
| 5,243,538 | 9/1993 | Okuzawa | 716/5 |
| 5,359,537 | 10/1994 | Saucier | 716/18 |
| 5,465,216 | 11/1995 | Rotem | 716/5 |
| 5,504,690 | 4/1996 | Kageyama | 716/2 |
| 5,649,165 | 7/1997 | Jain et al. | 716/5 |
| 6,026,222 | 2/2000 | Gupta et al. | 716/5 |

OTHER PUBLICATIONS

G.D. Hachtel et al., "Verification Algorithms for VLSI Synthesis", IEEE Transactions on Computer–Aided Design of Integrated Circuits and Systems, vol. 7, No. 5, May 1988, pp. 616–640.

P. Lammens et al., "Correctness Verification of VLSI Modules Supported by a Very Efficient Poolean Prover", 1989 Int'l Conf. On Computer Design: VLSI in Computers and Processors, ICCD '89, pp.266–269.

E. Cerny, "A Compositional Transformation for Formal Verification", 1991 IEEE Int'l Conf. On Computer Design: VLSI in Computers and Processors, ICCD '91, pp. 240–244.

P. Jain et al., "Hierarchical Constraint Solving in the Parametric Form with Applications to Efficient Symbolic Simulation Based Verification", 1993 Int'l Conf. On Computer Design: VLSI in Computers and Processors, ICCD '93, pp. 304–307.

M. Agrawal et al., "The Boolean Isomorphism Problem", 37th Annual Symposium on Foundations of Computer Science, 1996, pp. 422–430.

Allen Van Gelder, "A Propositional Theorem Prover to Solve Planning and Other Problems,"Annals of Mathematics & Artifical Intelligence, (Aug. 9, 1998).

Tracy Larrabee,"Test Pattern Generation Using Boolean Satisfiability," Transactions on Computer Aided Design, vol. II (No. 1), (Aug. 9, 1992).

Hantao Zhang, "SATO: An Efficient Propositional Prover," International Conference on Automated Deduction—printed in LNAI #1249, Springer–Verlag, p. 272–275, (Aug. 9, 1997).

Randal Bryant, "Graph–Based Algorithms for Boolean Function Manipulations," IEEE Transactions on Computers 35:8, p. 677–691, (Aug. 9, 1986).

Randal Bryant, "Symbolic Boolean Manipulation With Ordered Binary Decision Diagrams," ACM Computing Surveys, (Aug. 9, 1992).

Biere et al., "Symbolic Model Checking Without BBD's," TACA '99 Lecture Notes in Computer Science, Springer–Verlag, (Aug. 9, 1999).

M. Davis; H. Putnam, "A Computing Procedure for Quantative Theory," Journal of Association for Computing Machinery, vol. 7 (No. 3), (Aug. 9, 1960).

*Primary Examiner*—Eric W. Stamber
*Assistant Examiner*—Russell W. Frejd
*Attorney, Agent, or Firm*—Olive & Olive, P.A.

[57] ABSTRACT

A computer implemented method for verifying that a circuit or other system satisfies its specifications, is based on creating a first Boolean formula G representative of the system and its specification and through a series of steps creating a second formula G' having a known logical relationship to G and using the second formula G' to determine whether the system satisfies its specification.

17 Claims, 15 Drawing Sheets

Simplification Module

Simplification Module

Formula Transformation Module

Subformula Replacement Module

Procedure Simp

Procedure Sat

Simplification Module

Verification Module

Sequence of Interpretations and Tests in simp

Sequence of Interpretations and Tests in sat

Tests Omitted if $(A \parallel I \cup \{x\})$
is Unsatisfiable or a Tautology

Tests Omitted if A[false,y,z] is Unsatisfiable

Modular Circuit

Staged Circuit

Repetitive Circuit

Duality

METHOD FOR DESIGN VERIFICATION OF HARDWARE AND NON-HARDWARE SYSTEMS

This application is a Continuation-in-Part of Ser. No. 09/306,136, filed May 6, 1999, now abandoned.

BACKGROUND OF THE INVENTION

1. Field of the Invention

The present invention relates to a computer implemented method for verifying that a circuit or other system satisfies its specification, which operates at a low level and is based on quantified Boolean logic rather than first-order or higher-order logic.

2. Background of the Prior Art

Errors in the design of complex systems, such as computer chips, can be very costly. Computer chip verification (also referred to herein as computer hardware verification) determines whether the circuitry on a computer chip or other computer hardware device operates properly, typically in accordance with its specifications. Since computer chip verification is one of the most expensive facets of chip design, there is substantial interest in the industry aimed at finding cheaper and faster verification methods.

The general method known in the art, by which Boolean formulae are used, by computer programs for system testing is the following:

(1) A Boolean formula G is constructed from a system S and its specification, expressing that the system does not satisfy its specification. Methods for generating G are well known.

(2) The formula G is tested for satisfiability (consistency).

(3) If G is unsatisfiable, then S is correct. If G is satisfiable, then there is an error in S, and the nature of the satisfiability of G can help to identify the error in S.

G can also be constructed to express that S does satisfy its specification and then G is tested to determine if it is a tautology, if so, S is correct, if not S is incorrect.

The system S can be a computer circuit or some system containing interconnected objects, which can be defined as a component or part of a physical system, such as a gate in a circuit. A general explanation for the method known in the art by which Boolean formulae are used for system testing is to define A as a Boolean formula representing the system S and B is a Boolean formula representing the statement that S fails to satisfy its specification. Then G can be taken to be the conjunction A∧B of these two formulae, expressing that S fails to satisfy its specification. If A∧B is unsatisfiable, this means that there is no way that S can fail to satisfy its specification, so S satisfies its specification. If A∧B is satisfiable, there is an error in S. There are also other ways in which G can be generated from A and B. These other ways include the disjunction ((not A) or (not B)) which expresses that S does satisfy its specification.

Discussed briefly below are known examples of different methods used to verify the correctness of any system of interconnected objects.

As stated above, it is generally known in the art that a circuit can be verified by translating the circuit into Boolean formulae and testing the formulae for satisfiability. Typical satisfiability tests process the whole formula at once. One method of representing a circuit by a Boolean formula for testing purposes is given in (Larrabee, Tracy, Test Pattern Generation using Boolean Satisfiability, *IEEE Transactions on Computer-Aided Design* 11:1 (January, 1992) 4–15). Larrabee conducts the satisfiability tests in a way that involves looking for a pattern of inputs that will cause certain kinds of errors to appear.

Recently, binary decision diagrams (BDD's) have become very popular with chip designers because they permit the verification of the equivalence of two circuits with computer assistance without explicit testing on all inputs. BDD's transform a circuit into a canonical form, depending on an ordering of the Boolean variables, and two circuits are equivalent if and only if they have the same canonical form. For many kinds of circuits, BDD's work very well, especially when a good ordering of the variables can be found. Testing equivalence is important, because one can verify a new or optimized circuit by showing that it is equivalent to an old and trusted circuit. BDD's are presented in Bryant, R. E., Graph-based algorithms for Boolean function manipulation, *IEEE Transactions on Computers* 35:8 (1986) 677–691.

Another approach to hardware verification is to use an expressive theorem prover such as high-order logic (HOL) for this purpose. This approach is described in the paper (A. Camilleri, M. Gordon, and T. Melham, "Hardware Verification using Higher-Order Logic," *Proceedings of the International Federation for Information Processing International Working Conference: From HDL Descriptions to Guaranteed Correct Circuit Designs*, Grenoble, France, Sep. 9–11, 1986). Another expressive verifier for formal design validation is described in (N. Shankar, S. Owre, and J. M. Rushby, "The PVS Proof Checker: A reference manual," Computer Science Laboratory, SRI International, Menlo Park, Calif., 1993). The use of such high-level provers permits proofs of complex systems to be achieved. The disadvantage of using HOL or a high-level language is that such HOL or high-level proofs are time consuming and may not verify the correctness of a hardware circuit at the gate level.

Another method of verifying the correctness of a hardware circuit is by specifying the system's design using a high-level language such as VHDL (IEEE Standard VHDL Language Reference Manual (IEEE Std 1076-1987)), and then transforming this design to the register level (specifying how the contents of one register at a given time depend on the contents of other registers at the preceding time). Verification with a high-level language involves testing the circuit and determining whether it operates in accordance with a VHDL specification. However, the VHDL analysis does not specify how the circuit is implemented by gates. To determine how a circuit is implemented by gates, the VHDL specification would need to be transformed into a register level and then to the gate level, and verified again. The system at the gate level can be represented, of course, by Boolean formulae. Finally, once the chip's design is determined to be correct, the design is transformed to the silicon level.

Satisfiability algorithms for Boolean formulae in clause form can also be used for hardware verification. In this approach, the circuit is transformed into a formula in clause form, which is a special form of unquantified Boolean formula. The specification of the circuit is also translated into a formula, and these two formulae are combined to obtain a formula expressing that the circuit is correct (or incorrect). An efficient method such as Davis and Putnam's method can then be applied to test if the formula is satisfiable. This method was first described in the paper (Davis, M. and Putnam, H., A computing procedure for quantification theory, *J. ACM* 7 (1960) 201–215), though modern implementations differ in some ways. If the Boolean formula expresses that the circuit is incorrect, and the Boolean formula is unsatisfiable, then the circuit is correct. If the formula is satisfiable, then the circuit is incorrect. If the formula expresses correctness of the circuit, then the circuit is correct if and only if the formula is a tautology, meaning, as used here, that the formula is always true. A recent, very efficient implementation of Davis and Putnam's method is described in (Zhang, H., SATO: *An Efficient Propositional Prover*, International Conference on Automated Deduction (CADE 97), Number 1249 in LNAI, pages 272–275, Springer-Verlag, 1997). Another method for satisfiability testing of unquantified Boolean formulae, not necessarily in clause form, is disclosed in the European Patent No. 0403 454, 1995 of Stalmarck, G., entitled *A System For Determining Propositional Logic Theorems By Applying Values And Rules To Triplets That Are Generated From A Formula*.

As further background, it is to be noted that symbolic model checking is concerned with verifying that systems which operate in real time are correct. Symbolic model checking is a general term that has arisen in the industry and refers to currently popular methods of verifying the correctness of any system of interconnected objects that have discrete states and interact in real time. A book about symbolic model checking is (McMillan, K. L., *Symbolic Model Checking: An Approach to the State Explosion Problem* (Kluwer, 1993)). The use of BDD's for symbolic model checking was a breakthrough, because it permitted much larger systems to be verified than was possible before. BDD's permit the state of a system to be represented and manipulated efficiently, in many cases. However, the paper (Biere, A., Cimatti, A., Clarke, E., and Zhu, Y., Symbolic Model Checking without BDD's, in TACAS'99, *Lecture Notes in Computer Science*, Springer-Verlag, 1999) gives some Boolean formulae obtained from symbolic model checking problems on which satisfiability algorithms such as Davis and Putnam's method and Stalmarck's method are more efficient than BDD's. There is therefore also an interest in seeing how far satisfiability-based approaches can extend in symbolic model checking applications.

Thus, it has been shown that satisfiability algorithms are often slower than binary decision diagrams for hardware verification. However, on certain kinds of Boolean formulae, representing systems being verified, satisfiability algorithms are faster. Thus, this invention seeks to provide a more efficient approach based on satisfiability tests that is practical for a wider variety of systems.

The Boolean formulae used for hardware verification are typically quantifier-free. However, the free variables can be regarded as universally or existentially quantified, and thus, these formulae can be regarded as quantified Boolean formulae. There are also certain additional formulae arising in symbolic model checking which are quantified. Testing equivalence of circuits can be done using quantified Boolean formulae. Thus, the present invention recognizes that quantified Boolean formulae have applications to verification methods.

With the foregoing in mind, it is the general object of the present invention to provide a method of verifying whether a system satisfies predetermined constraints, often contained in the system's specification.

It is still another object of the present invention to use satisfiability algorithms with quantified Boolean formulae by breaking down the verification process into smaller steps that are easier to perform.

It is yet another object of the present invention to find another formula F' equivalent to a formula F and providing desired subformulae.

It is also an object of the present invention to simplify F' to a formula F" having selected variables and quantifiers contained in F' removed, and to test the satisfiability of F".

The foregoing and other objects will become apparent as the description proceeds.

SUMMARY OF THE INVENTION

The present invention is a computer implemented method for verifying that a circuit or other hardware or non-hardware system satisfies its specification. With regard to hardware circuitry, this methodology operates at the gate level, and is based on quantified Boolean logic rather than first-order or higher-order logic. The method of the present invention operates at such a low level (Boolean logic) so that it can make use of very efficient search techniques which can examine a large number of possibilities in a short time, and provides mechanisms for making Boolean logic more expressive by introducing new definitions.

The method of the present invention can operate on a standard computer system having a user interface, a storage medium to store files, and processing means for data and computer programming of the invention.

The method of the present invention utilizes a number of modules adapted to interact with each other and to be selectively applied and guided. At the top level is a simplification module, which accepts a formula G obtained from the circuit or system and its specification, and finds another formula that has fewer quantifier occurrences or free variables. In this way, a collection $Q_S$ of quantified Boolean formulae is obtained, starting with G, and in which each formula in this collection is obtained from the previous one by making reference to a representation of the system S and applying the simplification module, which removes selected variables and quantifiers. After repeated calls to the simplification module, the last created formula in the collection $Q_S$ can be tested for satisfiability or validity. If this last formula is equivalent to G, and this last formula is unsatisfiable, then G is also unsatisfiable. The formula G typically expresses that the circuit or system does not satisfy its specification. If this formula turns out to be unsatisfiable, then it is known that the circuit or other system satisfies its specification and is correct. The verification module produces a proof that the output of the simplification module is correct, that is, that the formula G is indeed unsatisfiable. This proof can be checked to insure that this conclusion is correct, independently of whether the other modules have errors in them. Alternatively, if the formula G is shown to be satisfiable, then the verification module can produce an interpretation satisfying the formula, and this interpretation can help to identify the error in the circuit or system. The simplification module consists of a formula transformation module which makes reference to a representation of the system S and transforms a formula F in an equivalence-preserving manner to obtain a formula F' which has a subformula A of a form that is acceptable to the replacement module, which processes this subformula A to obtain another subformula A' with some quantifiers or free variables omitted. The subformula A represents one or more objects of the system S or parts of the system's constraints, or both. The simplification module then replaces the original subformula A in F by this other subformula A', and stores the resulting formula F" in a storage medium of a computer system. By a sequence of such transformations, the simplification module obtains a formula much simpler than the original one, for which satisfiability may be much easier to test. The simplification module makes use of a formula selection module for choosing the subformula A to process, and this module calls special procedures for formulae obtained from circuits or systems possessing certain special properties. There is also afonnula decomposition module which recognizes formulae that can be decomposed into parts not sharing free variables, in order to make satisfiability testing and formula replacement more efficient, and a definition introduction module which adds new Boolean variables defined in terms of existing ones, in order to make Boolean logic more expressive. Dual methods apply to formulae with universal quantifiers and existential ones interchanged.

DETAILED DESCRIPTION OF PREFERRED EMBODIMENTS OF THE INVENTION

A computer implemented methodology is presented for verifying properties of circuits or other systems using quantified Boolean formulae describing them, by simplifying these Boolean formulae to decide if they are satisfiable or not, or to obtain simpler Boolean formulae equivalent to the original ones. This has applications in symbolic model checking. It can also be applied to test satisfiability of unquantified Boolean formulae, which has applications in hardware verification. Our approach has the efficiency of Davis and Putnam-like satisfiability testers but decomposes the verification task into smaller subtasks, permitting large problems to be solved by a sequence of simplification steps, where each such step can require much less effort than a direct solution of the entire problem. Examples of hardware and non-hardware systems to which the invention can be applied include collision avoidance aircraft systems, electrical power distribution systems, planning problems, and railway control systems.

Figure 1:
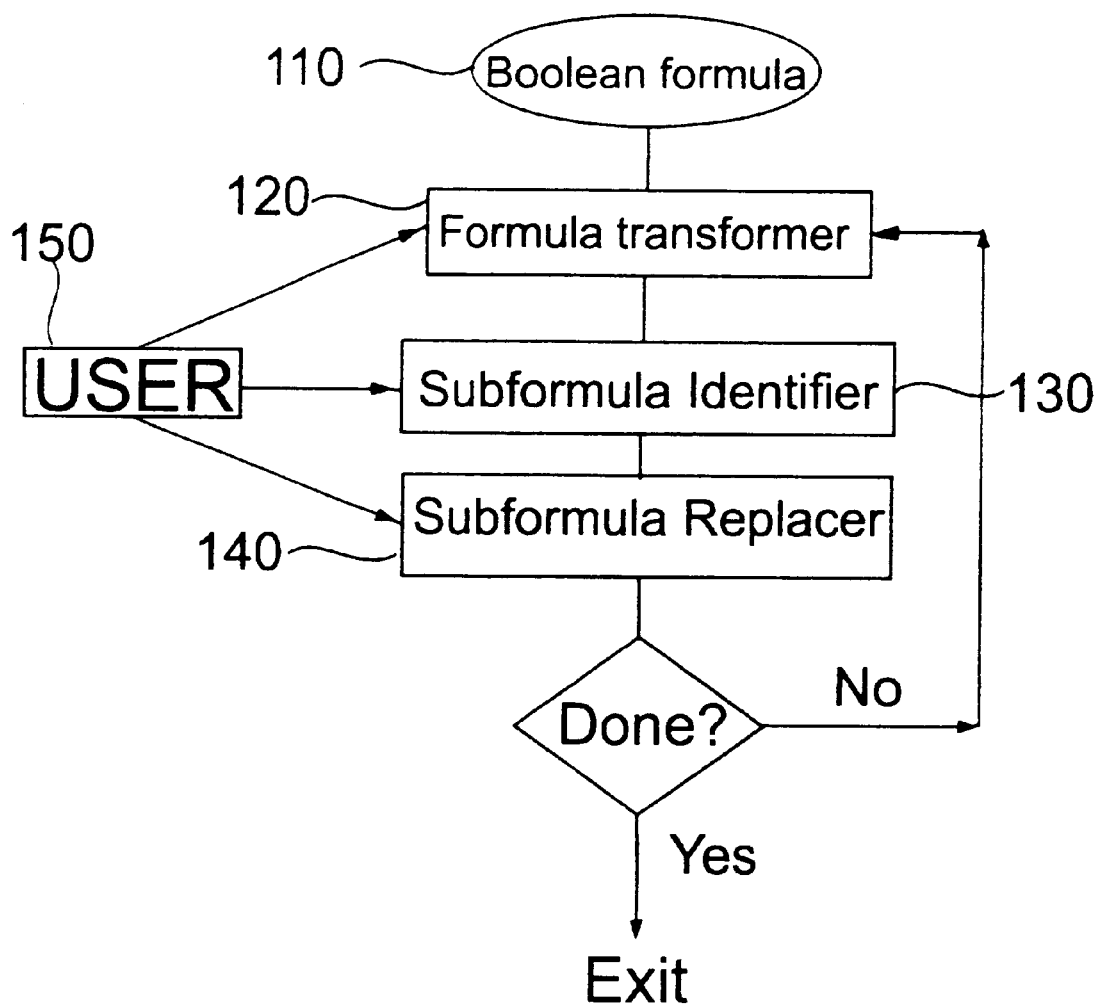
FIG. 1 is a flow chart showing the simplification module of the invention
Figure 2:
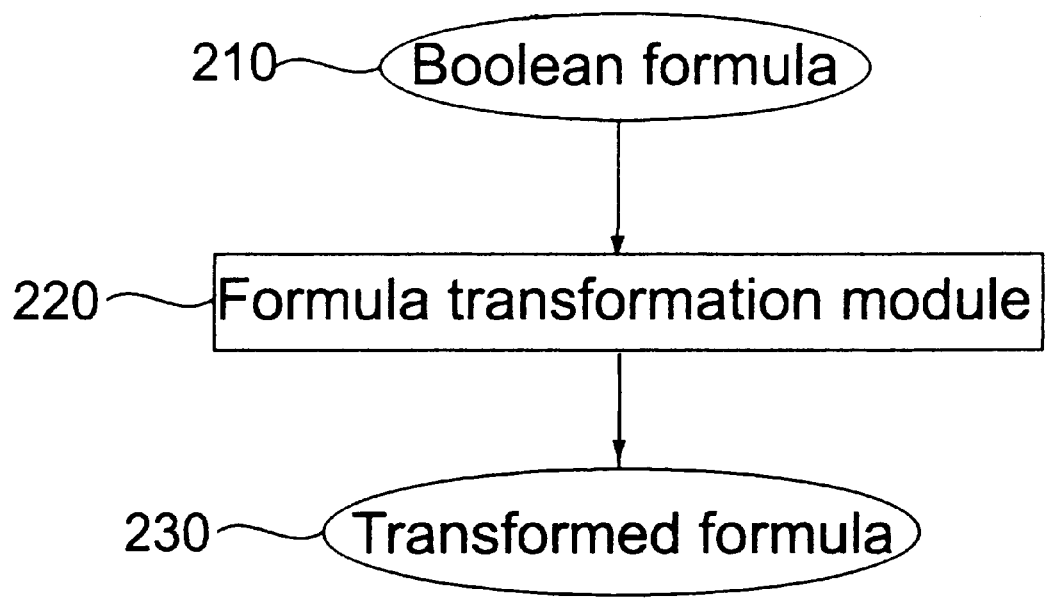
FIG. 2 is a flow chart showing the formula transformation module of the present invention.
Figure 3:
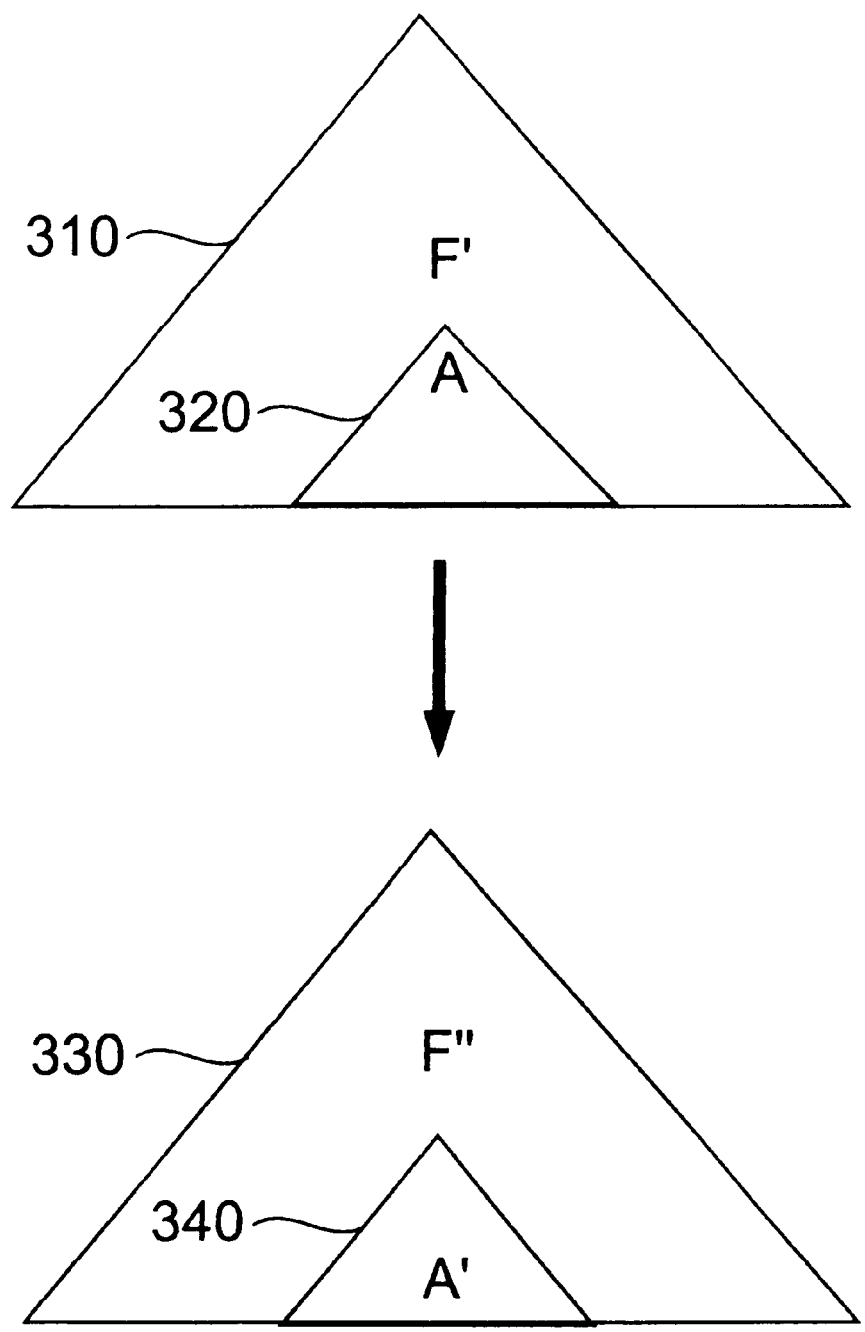
FIG. 3 is a flow diagram of the subformula replacement module of the present invention.

This methodology uses a computer implemented system which executes a number of modules comprised of computer programming of the invention. These modules interact with each other and are adapted to be guided by an operator. The invention method permits the operator to make choices among various possible methods and to observe the performance of various modules, and by so doing to modify the strategy to most effectively treat the problem at hand. Reference is next made to the computer software used to produce the method of the invention. As shown in FIG. 1, at the top level is a simplification module which accepts a Boolean formula 110 as input and calls on a formula transformation module 120 and a subformula identifier module 130. The former transforms the formula F so that it has a subformula that can be simplified. The subformula identifier module chooses a subformula to process. This subformula is processed by the subformula replacement module 140. This process is under the guidance of a user 150. There are a number of methods that can be used to process and simplify the subformula. The invention method thus permits the operator to guide the choice of these methods. In so doing, the operator will be able to examine a model or diagram of S in order to know how to guide these modules. FIG. 2 illustrates the formula transformation module 220, which accepts a Boolean formula 210 as input and produces a transformed formula 230 as output. FIG. 3 illustrates the subformula replacement module, which transforms a formula F' 310 having a subformula A 320 into a formula F" 330 having subformula A of F' replaced by the formula A' 340.

A high-level view of how this process is guided will first be given. The use of a diagram or physical model of the system and its specification (said specification also referred to as constraints) is essential to give the user insight into the structure of the system. The user will view this diagram, which may be hard copy or may be represented using computer graphics, to select a subsystem S' of the system S and its specification to process. The subsystem S' will typically consist of objects of the system which are highly interconnected with each other, but have relatively few connections with the rest of the system. For example, S' might be a component (object) of an integrated circuit, and then its connections with the rest of the system would be the wires connecting it with other components. In other cases, the boundaries between S' and the rest of S might not be so well-defined. S' may also include part of the specification. Such a subsystem S' will correspond to a part of the diagram in which many elements are interconnected, but have fewer connections with the rest of the diagram. The parts of S' will correspond to Boolean variables in the formula F representing S. Some of these variables (call them X) will correspond to the internal structure of S' and some of them (call them Y) will correspond to interactions between S' and the rest of the system. The user then attempts to transform the formula F using the formula transformation module to obtain a formula F' having a subformula A representing the subsystem S'. Such a subformula A should typically contain all of the Boolean variables in S' and as few others as possible. Then A is stored in a storage medium of a computer system and processed by the formula replacer module to obtain another formula A' having selected variables and quantifiers contained in A removed, said variables and quantifiers corresponding to one or more objects of said system or parts of said system's constraints. Typically A' will contain the variables Y, but the variables X representing the internal structure of S' will have been eliminated from A'. The formula F" is then F' with A replaced by A'. This formula F" is then stored in a storage medium of a computer system for further processing.

The use of diagrams by the user enables the user to make a good choice of how to transform F, select a subformula, and process the subformula according to the method of the invention. Thus the use of such a model or diagram becomes an integral part of the practice of the method of the invention.

Initially, a quantified Boolean formula G is obtained from the system S and its specification. This formula G may be processed by a call to the simplification module to obtain another quantified Boolean formula, and this other formula may then be processed by another call to the simplification module to obtain yet another quantified Boolean formula, and so on. In this way, a collection $Q_S$ of quantified Boolean formulae is created by repeated calls to the simplification module, making reference to a representation of the system S. The last created quantified Boolean formula in said collection is stored in a storage medium of a computer system, and this last created formula and possibly others in the collection are processed to obtain a response indicative of whether said system S satisfies predetermined constraints.

First some terminology is presented, then the simp and sat procedures of the simplification module, and then the refinements are described. Next, some applications to satisfiability testing are illustrated, after which equivalence testing and fixpoints are illustrated. Finally, some test results are given.

Terminology

Satisfiability. (Informal Description) A Boolean formula is constructed from variables and Boolean operators such as "and", "or", and "not." An example is (x and y). Such a formula is satisfiable if it is possible to replace the variables by true and false in such a way that the entire formula becomes true. Thus (x and y) is satisfiable because both variables can be replaced by true and (true and true) is true. The formula (x and not(x)) is unsatifiable, because no matter whether x is replaced by true or false, the formula is false. Testing satisfiability directly by examining all ways of replacing the variables by truth-values (true and false) can be too expensive in many cases, because there are too many combinations of truth values to consider. Therefore, methods of determining satisfiability that work faster in many cases are next presented.

Boolean quantifiers and operators. E is used for existential quantification and A for universal quantification. $\wedge$ is used for logical conjunction (and), $\vee$ for logical disjunction (or), and "not" or "−" for logical negation. The symbol == is used for equivalence and + for exclusive or. The constants true and false are called truth values. The Boolean operators are defined on truth values in standard ways, so that (x$\wedge$y) is true if and only if x is true and y is true, (x$\vee$y) is true if and only if x is true or y is true, not(x) is true if and only if x is false, x==y is true if and only if x and y have the same truth value, and (x+y) is true if and only if x and y have different truth values. Capital letters (like X and Y) refer to sets or sequences of Boolean variables.

Formulae. A Boolean formula is a formula built up from Boolean variables and the Boolean operators of conjunction, disjunction, negation, and other Boolean operators. Thus (x$\wedge$(y$\vee$z)) is a Boolean formula. Boolean quantifiers are also allowed to occur in Boolean formulae. Thus if B is a Boolean formula and X is a set of Boolean variables, then (EX)B and (Ax)B are also Boolean formulae, where (EX) is considered an existential quantifier and (AX) is considered a universal quantifier. (AX)B is often considered to abbreviate not(EX)not(B). If X is the set or list {x,y,z}, then (EX)A abbreviates the Boolean formula (Ex)(Ey)(Ez)A. An example of a quantified Boolean formula is (Ex)(x$\wedge$not((Ey)(y$\vee$z))). An occurrence of a variable x in a formula A is called free if this occurrence is not within the scope of a quantifier (Ex) or (Ax). Only the occurrence of z is free in the example formula. Variable occurrences that are not free are called bound. If A is a Boolean formula and X is a set of variables, then A[X] denotes a formula A that contains the free variables X. A formula B having the free variables X is often taken to abbreviate (EX)B or (AX)B A literal is a Boolean variable or its negation. If y is a variable, it is assumed that not(not(y)) is identical to y. The literal not(y) is the complement of y, and likewise y is the complement of not(y). The literals y and not(y) are said to be complementary. A clause is a disjunction of literals, as, (x $\vee$ not(y)$\vee$z). A set of clauses is a conjunction of clauses, such as C$\wedge$D$\wedge$E, where C, D, and E are clauses.

Subformulae. Each Boolean formula A is a subformula of itself. Also, if A is of the form (B op C), where "op" is a Boolean operator, and D is a subformula of B or C, then D is also a subformula of A. Likewise, if D is a subformula of B, then D is a subformula of not(B) and a subformula of (QX)B where Q is E or A.

Simplifications. For a Boolean formula A, A$\|$y refers to A with all free occurrences of the Boolean variable y replaced by true, and the resulting formula simplified as many times as possible with respect to usual Boolean simplifications. These are the following: B$\wedge$ true simplifies to B, B$\wedge$ false simplifies to false, true $\wedge$B simplifies to B, false $\wedge$B simplifies to false, true $\vee$B simplifies to true, B$\vee$ true simplifies to true, false $\vee$B simplifies to B, B$\vee$ false simplifies to B, not(true) simplifies to false, not(false) simplifies to true, B==true simplifies to B, B==false simplifies to not(B), true==B simplifies to B, false==B simplifies to not(B), true+B simplifies to not(B), false+B simplifies to B, B+true simplifies to not(B), B+false simplifies to B, and (Ex)B and (Ax)B simplify to B if there are no free occurrences of the variable x in B. Also, A$\|$(not(y)) refers to A with all free occurrences of the variable y replaced by false, and the resulting formula likewise simplified. There are also additional simplifications B$\wedge$p simplifies to (B$\|$p)$\wedge$p and p$\wedge$B simplifies to p$\wedge$(B$\|$p) if p is a literal. If A is a Boolean formula and x is a Boolean variable, then (E x)A is defined to be equivalent to the formula (A$\|$x)$\vee$(A$\|$(not(x))).

Interpretations. An interpretation is a set I of literals, often viewed as a conjunction of its elements, such that no pair of complementary literals occur in I. If I is an interpretation and A is a Boolean formula, then A$\|$I is A with all occurrences of x replaced by true, for x in I, and all occurrences of x replaced by false, for x such that not(x) is in I, with simplifications applied as before. The formula A$\|$I is read "A relative to I." A formula B is satisfiable if there is an interpretation I such that B$\|$I is true. Such an interpretation I is said to satisfy B. An interpretation I such that B$\|$I is false is said to contradict or falsify B. A formula B is falsifiable if there is an interpretation I such that B$\|$I is false. If B is not satisfiable, then B is unsatisfiable. A formula B is a tautology if for all I which assign truth values to all free variables of B, B$\|$I is true. Two formulae A and B are equivalent if and only if for all interpretations I of their free variables, A$\|$I is true if and only if B$\|$I is true. A formula A is said to logically imply a formula B if and only if for all interpretations I of the free variables of A and B, if A$\|$I is true then B$\|$I is true. Also, a formula A logically implies B if and only if the formula (not A)$\vee$B is a tautology.

Equivalences. As the standard Boolean equivalences which may be used for transforming formulae into equivalent formulae, the following may be taken, possibly with others added: (A op B)==(B op A) where "op" is ∧, ∨, ==, or +, (A op B) op C==A op (B op C), where "op" is ∧, ∨, ==, or +, not(not(B))==B, not(A∧B)==not(A)∨not(B), not(A∨B)==not(A)∧not(B), not(A==B)==(A+B), not(A+B)==(A==B), (A∧(B∨C))==(A∧B)∨(A∧C), (A∨(B∧C))==(A∨B)∧(A∨C), (A==B)==(A∧B)∨(not(A)∧not(B)), (A+B)==(A∧not(B))∨(not(A)∧B), (QX)(A op B)==((QX)A) op B where "op" is ∧ or ∨ and Q is E or A, and the variables X do not occur free in B, (QX)B==B if the variables X do not occur free in B, (AX)B==not(EX)not(B), (EX)B==not(AX)not(B), (EX)(EY)B==(EY)(EX)B, (AX)(AY)B==(AY)(AX)B, (EX)(A∨B)==((EX)A)∨((EX)B), and (AX)(A∧B)==((AX)A)∧((AX)B)). These may be used in either direction. These are applied by the formula transformation module, illustrated in FIG. 2.

Duals. If a formula A has only the Boolean operators ∧, ∨, and "not" and quantifiers, then a formula B is called the dual of A if B is obtained from A by interchanging the Boolean operators ∧ and ∨ and interchanging the quantifiers A and E and adding an additional negation to all the Boolean variables. Such a B is equivalent to not(A). It is often the case that a method which applies to a formula A can also be applied to the dual B of A with small modifications. For example, A is satisfiable if and only if the dual B of A is not a tautology.

Formulae are constructed from circuits as follows. A signal on a wire is identified with a Boolean variable. Each gate is converted into a Boolean formula expressing the required relationship between its input and output signals. Thus an "or" gate with inputs x and y and output z would be converted into the formula z==(x∨y). A formula representing the entire circuit is obtained as the conjuction (and) of all the formulae for its gates. This formula can be converted to clause form (if desired) by converting each of the gate formulae to clause form; standard methods for doing this are known. For example, the clause form for the formula z==(x∨y) is (not(z)∨x∨y)∧(not(x)∨z)∧(not(y)∨z).

Simp and Sat Procedures

Figure 4:
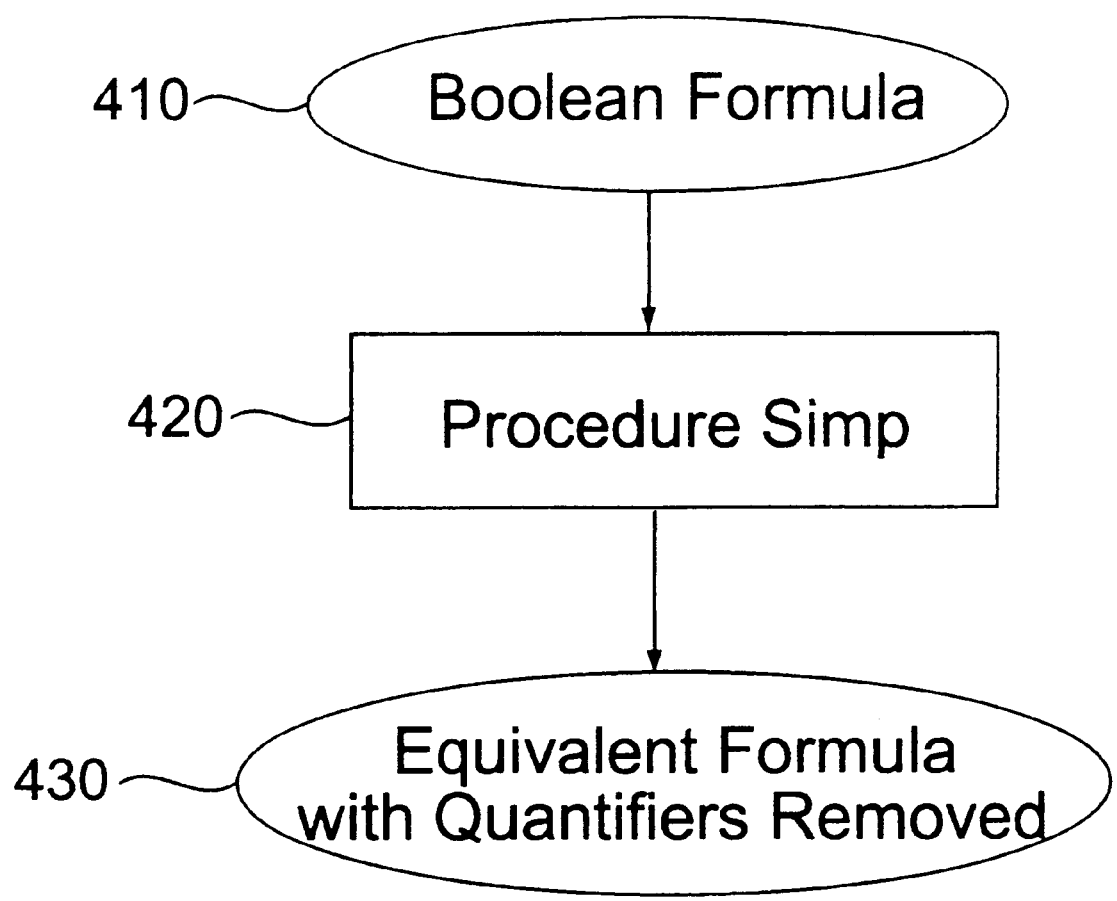
FIG. 4 is a flow diagram of the procedure simp of the present invention.
Figure 5:
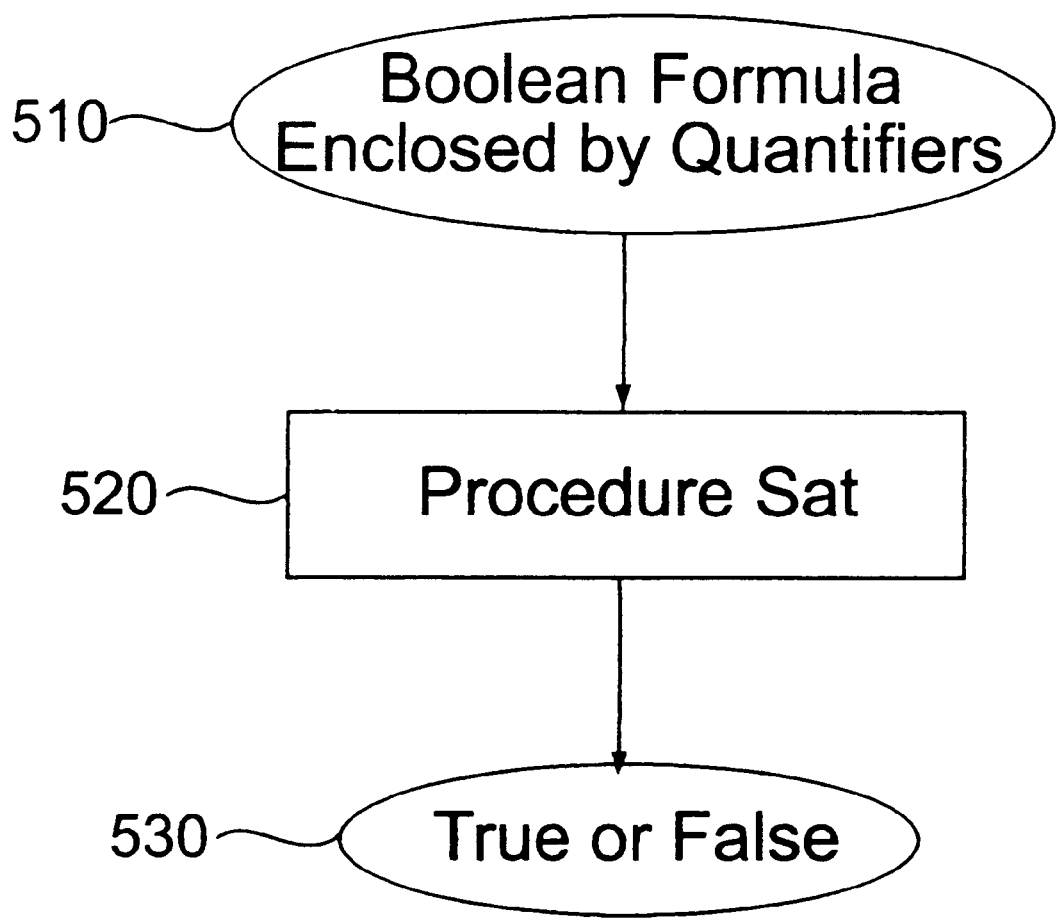
FIG. 5 is a flow diagram of the procedure sat of the present invention.

The simplification module consists of two procedures, simp (FIG. 4) and sat (FIG. 5) which can be used to replace a quantified Boolean formula by a simpler equivalent formula, together with a number of refinements which are subsequently described. FIG. 4 shows how the procedure simp 420 has a Boolean formula A 410 as input and produces an equivalent formula A' 430 having selected variables and quantifiers eliminated, as output. FIG. 5 shows how the procedure sat 520 has a Boolean formula 510 having no free variables as input and produces true or false 530 as output.

A general description of how the simp and sat procedures operate will now be given. Given a subformula A of F', quantified Boolean formulae in a collection $Q_A$ of formulae are first created, and then each such formula is tested for satisfiability, or falsifiability, or both. Some of these tests may be omitted when it is recognized that such tests are not necessary for the creation of the formula A'. The results of this testing are stored in a storage medium of a computer system, and then the formula A' is created from the results of this testing.

The procedure simp takes a Boolean formula A and produces another formula A'equivalent to A. It does this by considering a collection of interpretations (assignments of truth variables) to the free variables of A including all total interpretations of the free variables of A. Representations of these interpretations are stored in a storage medium of a computer system. Formulae in the collection $Q_A$ of quantified Boolean formulae of the form (A relative to I) for I in said collection of interpretations are created. These formulae are tested for satisfiability and for falsifiability. Some of these tests may be omitted for efficiency; in particular, the formula (A relative to I) need not be tested if there is an interpretation J in said collection such that testing of (A relative to J) provides a response that (A relative to J) is unsatisfiable or not falsifiable. If (A relative to I) is unsatisfiable and I is total, then it is assumed that testing of (A relative to I) will provide a response that (A relative to I) is unsatisfiable. For all interpretations I such that testing of (A relative to I) provides a response that (A relative to I) is unsatisfiable, a clause D expressing the negation of I is constructed. Finally, A' is taken as the conjunction of said clauses D.

Informally, the procedure simp gathers together a complete collection of interpretations $I_i$ that make A false, and for each one it constructs a clause $D_i$ expressing the negation of $I_i$. Then the conjunction (and) of the $D_i$ is equivalent to A, because this conjunction expresses the fact that none of the $I_i$ are true. Since all ways of making the formula A false have been excluded, the fact that A is true has been expressed. A' equivalent to A has been obtained, where A' is the conjunction of these $D_i$.

Figure 6:
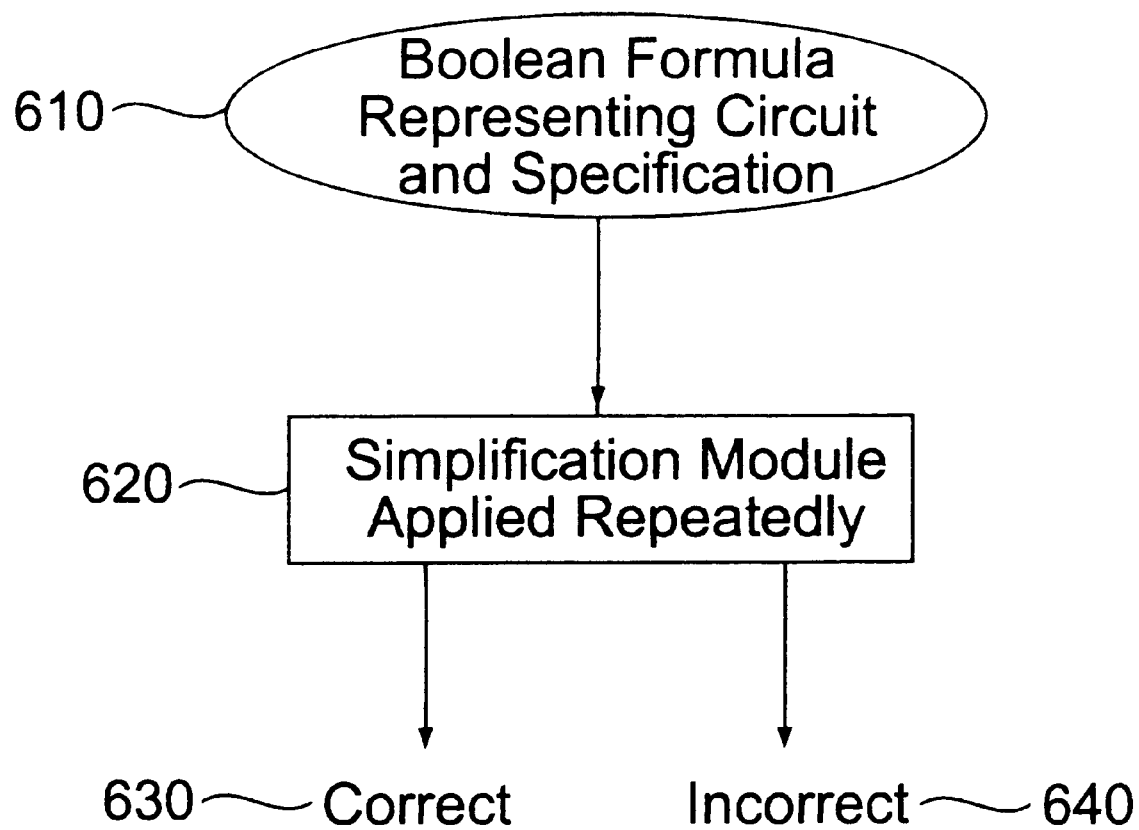
FIG. 6 is a flow diagram showing repeated use of the simplification module of FIG. 1.

Referring now to FIG. 4, the procedure simp takes a Boolean formula A and an interpretation I as arguments. It returns a set A' of clauses containing only the free variables of A such that if I is empty, then A' is logically equivalent to A. If A occurs in some other Boolean formula F', then let F" be F' with an occurrence of A replaced by A'. Then F" is equivalent to F'. Thus satisfiability of F' can be tested by finding some such subformula A, replacing it in F' by A', and testing satisfiability of F". Since F" is often simpler than F' (any non-free variables in A have been eliminated, at least), the invention recognizes that it may be simpler to test satisfiability of F" than F'. FIG. 6 illustrates how, by a sequence of applications of the simplification module 620, a quantified Boolean formula 610 can be reduced to either true or false, if F contains no free variables, implying that the system S is incorrect 640 or correct 630. Of course, universal quantifiers in F' can be replaced by existential quantifiers using the fact that (AX)C[X] is equivalent to not((EX)not (C[X])). This gives a decision procedure to decide if F is a tautology (it simplifies to true) or a contradiction (it simplifies to false). This procedure can also test if a formula F' with free variables is satisfiable, as follows: let Y be the free variables in F'. Then F' is satisfiable if and only if (EY)F' is a tautology, and whether (EY)F' is a tautology can be tested by reducing it to true or false by successive simplifications. There is also a verification module 71 0, illustrated in FIG. 7, which can print out proofs 720 of the correctness of the conclusions reached by the simplification module; such proofs can be checked 730 and found to be correct 740 or incorrect 750 to gain confidence in the correctness of said conclusions even if there may be errors in the modules of this invention.

The procedures simp and sat make use of two auxiliary procedures unsat and taut. The procedure unsat can return true, false, or * (unknown). The invention recognizes that these procedures unsat and taut must satisfy the following conditions:

(1) If unsat(B) returns true then B is unsatisfiable.
(2) If B is unsatisfiable and has no free variables then unsat(B) returns true.

(3) If unsat(B) returns false then B is satisfiable.

(4) If B is satisfiable and has no free variables then unsat(B) returns false.

(5) If taut(B) returns true then B is a tautology.

(6) If B is a tautology and has no free variables then taut(B) returns true.

Intuitively, unsat is a procedure that tests whether a formula is unsatisfiable, but it can give up before an answer is computed and return * (unknown) in some cases. Also, taut is a procedure for testing whether a formula is a tautology, and it can also give up before an answer is computed and return * (unknown) in some cases. Both unsat and taut can be arbitrary procedures for testing unsatisfiability or tautology. The fact that any such procedures can be used makes it possible during practice of the method of the invention to implement simp and sat without having to program unsat and taut and makes it possible for very efficient existing implementations of tests for unsatisfiability and tautology to be used.

Figure 8:
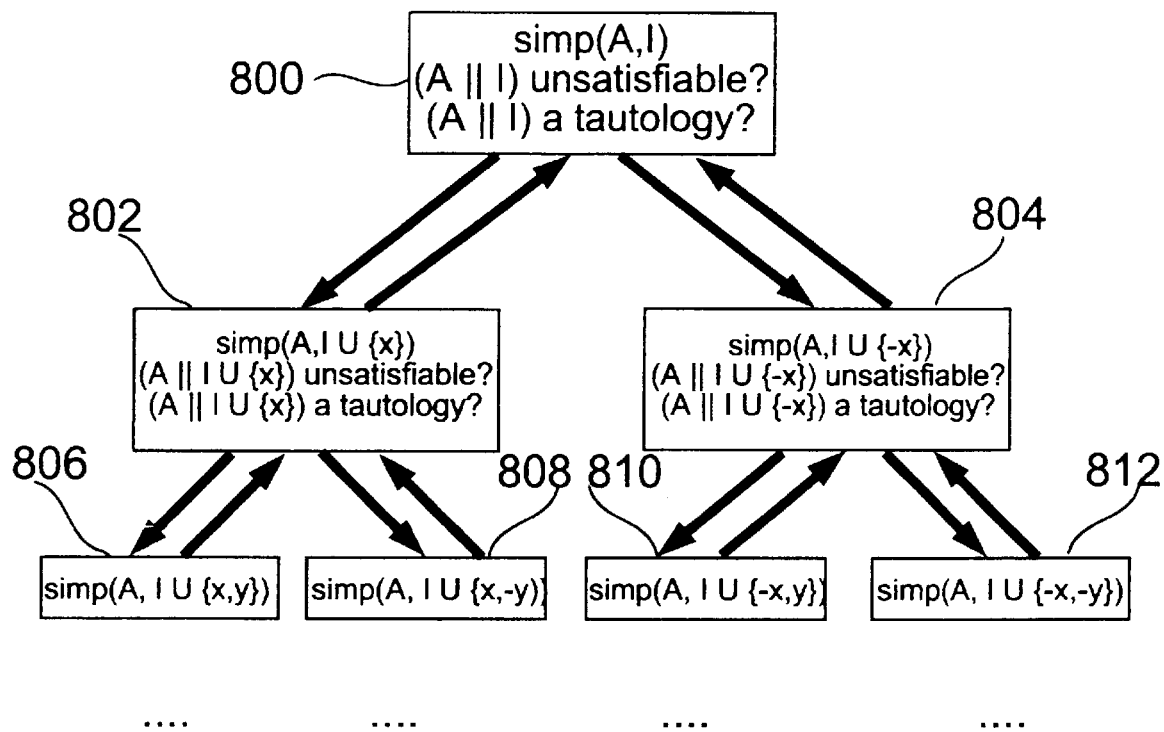
FIG. 8 is a flow diagram of the procedure simp of the present invention.

The procedure simp is defined as follows.

procedure simp(A,I)

if unsat(A‖I)=true then return(not($d_1$)∨not($d_2$)∨ ...∨ not($d_n$)) where D={$d_1$, $d_2$, ..., $d_n$} is a subset of I such that (A‖D) is unsatisfiable else if taut(A‖I)=true then return true else [for some free variable y in A, neither y nor not(y) occurs in I]

let y be some free variable in A such that neither y nor not(y) occurs in I;

let $A_1$ be simp(A, I U {y});

if not(y) does not occur in any clause of $A_1$‖I and $A_1$‖I is unsatisfiable then return $A_1$ fi;

let $A_2$ be simp(A, I U {not(y)});

if y does not occur in any clause of $A_2$‖I and $A_2$‖I is unsatisfiable then return $A_2$ fi;

return ($A_1$∧$A_2$)

fi fi fi end simp;

The operation of the procedure simp is illustrated in FIG. 8. Each time simp is called (800, 802, 804, 806, 808, 810, 812), tests are performed whether the indicated quantified Boolean formula is unsatisfiable or is a tautology. Such calls to simp will often create other calls to simp, in a sequence illustrated by the arrows. Now, simp(B) is defined for a Boolean formula B to be simp(B,{ }), that is, the result returned when simp(B,I) is called with I equal to the empty set. If A has no free variables, then simp(A) is either true or false. When simp(A,I) returns a formula B, then it is said that the bound variables of A have been eliminated from A to produce B. The procedure simp can be called on a formula without bound variables.

The procedure sat is a faster version of simp that applies when the free variables of A are existentially quantified. This quantification means looking for one interpretation that makes A true. In this case, the procedure can be stopped as soon as one such interpretation is found, and it is not necessary to continue looking for more.

Figure 9:
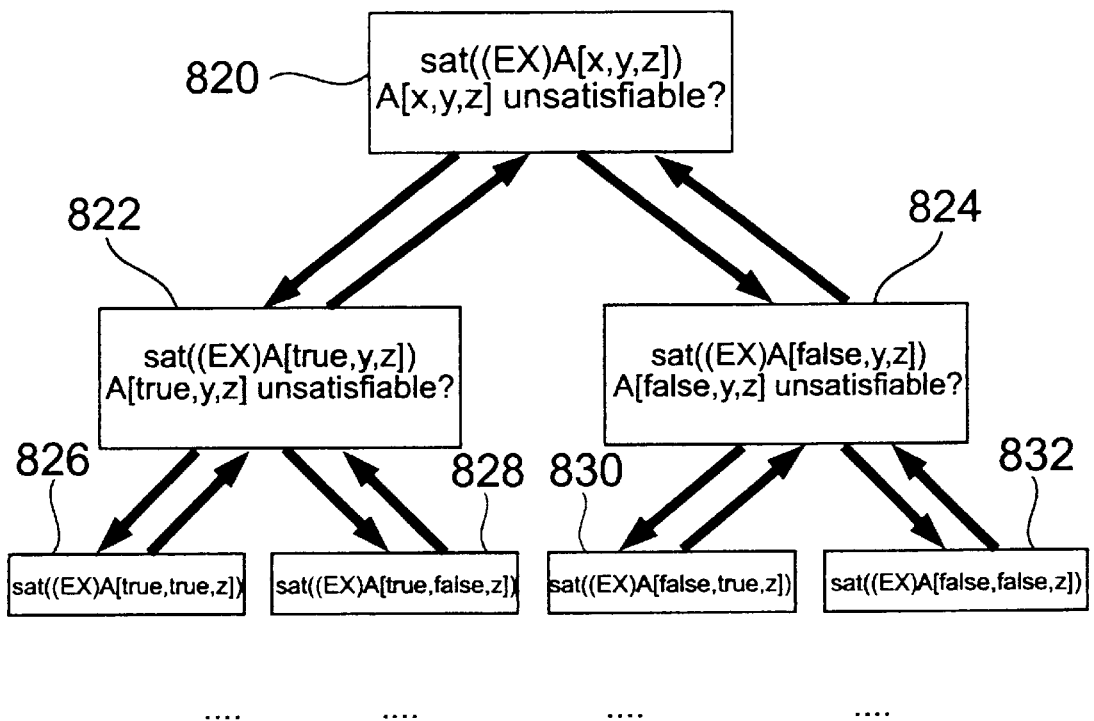
FIG. 9 is a flow diagram of the procedure sat of the present invention.

The above procedure simp can be modified to obtain such a procedure sat to test if formulae A of the form (EY)B are tautologies, assuming that all free variables in B are mentioned in Y, as follows:

procedure sat((EY)B)

if unsat(B)=true then return false else if unsat(B)=false then return true else [there is a free variable y in Y in the formula B]

let y be some free variable in the formula B let $B_1$ be sat((EY)(B‖y));

if $B_1$ is true then return true fi;

let $B_2$ be sat((EY)(B‖{not(y)}));

if $B_2$ is true then return true fi;

return false fi fi end sat;

Here U is set union. Like simp, sat is presented in a high-level manner, not in any specific programming language. If B is satisfiable, then sat((EY)B) will return true, else sat((EY)B) will return false. Equivalently, if (EY)B is a tautology, then sat((EY)B) will return true, else sat((EY)B) will return false. The operation of the procedure sat is illustrated in FIG. 9. Each time sat is called (820, 822, 824, 826, 828, 830, 832), tests are performed whether the indicated quantified Boolean formula is unsatisfiable or is a tautology. Such calls to sat will often create other calls to sat, in a sequence illustrated by the arrows. The procedure sat has an advantage over simp in that sat may stop sooner, and therefore take less time. However, sat cannot be called in as many cases as simp can. The procedure sat can be called on a formula in which the list X or Y of variables may be empty. The procedure sat can be extended to formulae of the form (AX)B by calling sat on (EX)not(B). If sat((EX)not(B)) returns false, then sat((AX)B) returns true; if sat((EX) not(B)) returns true, then sat((AX)B) returns false. This is justified by the fact that (AX)B is equivalent to not(EX)not (B). Equivalently, if B is not falsifiable (a tautology), then sat((AY)B) will return true, else sat((AY)B) will return false.

Figure 10:
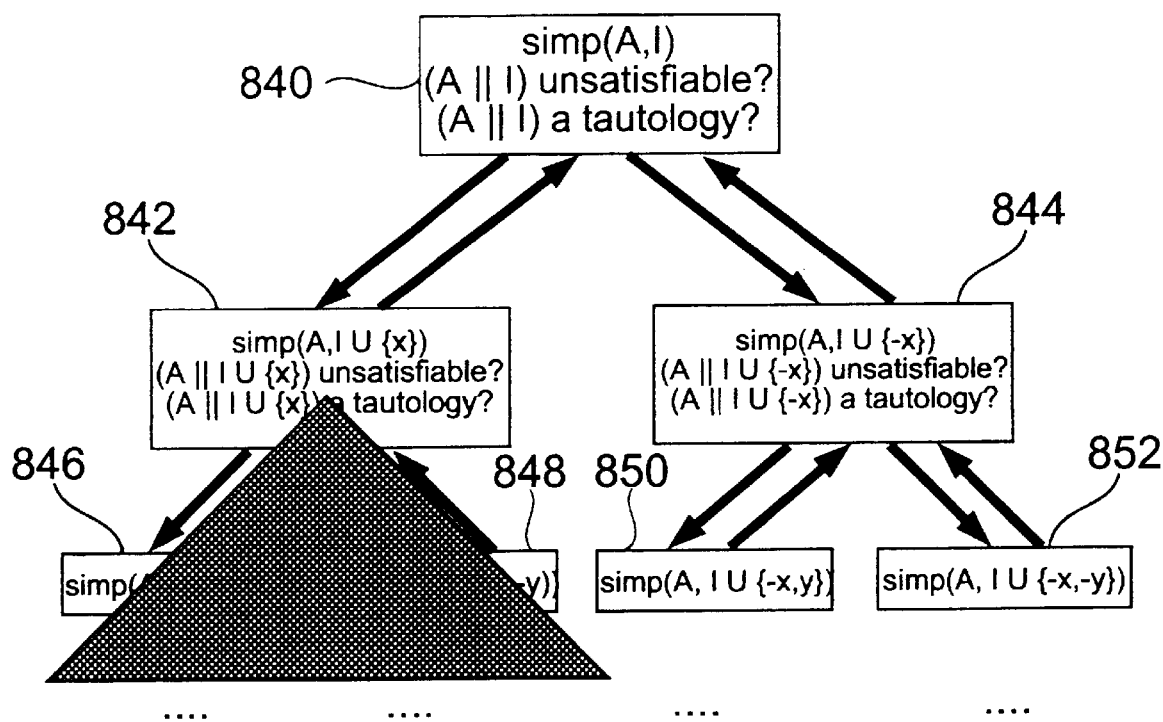
FIG. 10 is a diagram of the tests that may be omitted in the procedure simp.
Figure 11:
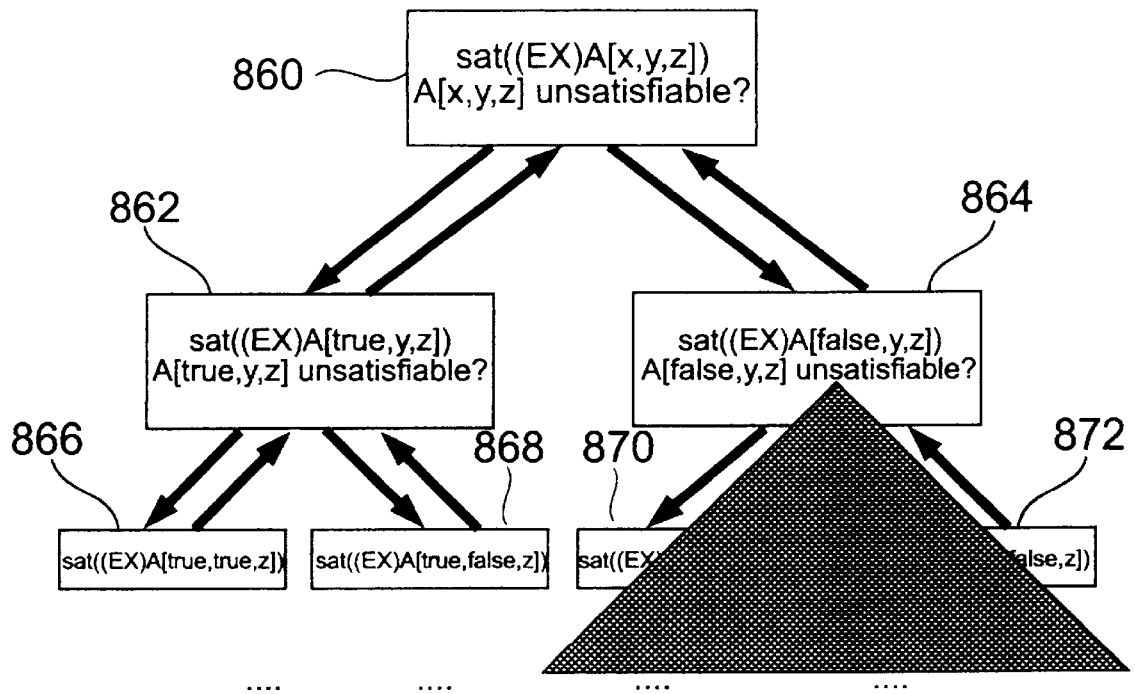
FIG. 11 is a diagram of the tests that may be omitted in the procedure sat.

The tests unsat and taut (these tests are called within sat and simp) can be done using an arbitrary decision procedure for quantified Boolean formulae. These procedures permit the procedures simp and sat to avoid some testing of quantified Boolean formulae in the sets $Q_A$ in some cases. This is illustrated in FIGS. 10 and 11. In FIG. 10, the calls 846 and 848 to simp are omitted if the call 842 provides a response that the indicated Boolean formula is unsatisfiable or is a tautology. In FIG. 11, the calls 870 and 872 to sat are omitted if the call 864 provides a response that the indicated Boolean formula is unsatisfiable. The procedures simp and sat can be called in two modes, inner mode and free mode. In inner mode, it is assumed that whenever simp(A,I) or sat(A) is called, then A is of the form (EX)B[X,Y] or (AX)B[X,Y] where B contains no quantifiers. Every quantified Boolean formula will contain at least one such subformula, so inner mode is sufficient to handle any quantified Boolean formula. In inner mode, whenever unsat(A) or taut(A) is called, and A has no free variables, then A is of the form (EX)B[X] or (AX)B[X] where B is an unquantified Boolean formula, that is, it contains no quantifiers. The formula (EX)B[X] is equivalent to true if and only if B is satisfiable, otherwise it is equivalent to false. The formula (AX)B[X] is equivalent to true if and only if not(B[X]) is unsatisfiable, otherwise it is equivalent to false. Thus in all cases, unsat and taut can be implemented using a satisfiability test for unquantified Boolean formulae if inner mode is used. Many methods are known for testing if unquantified Boolean formulae are satisfiable, including Davis and Putnam's method for formulae in clause form. These tests are typically applied to an entire formula at once to determine whether the whole formula is satisfiable. The invention works in smaller steps, which can make the entire process significantly more efficient. In free mode, the formula B[X, Y] may contain Boolean quantifiers. In this case, a procedure for satisfiability of arbitrary quantified Boolean formulae can be used. One possibility for this is to call simp or sat recursively on the formula B. Also, these successive calls to unsat and taut are permitted to have memory, in the sense that earlier calls may record information about A that can make later calls more efficient.

The part of the procedure simp that determines D can be done by unsat, as well; it suffices to return $(\text{not}(d_1) \vee \text{not}(d_2) \vee \ldots \vee \text{not}(d_n))$ where $\{d_1, d_2, \ldots, d_n\} = I$ when $\text{unsat}(A\|I)$ returns true. It is also possible to describe procedures that return smaller formulae, by noting which of the $d_i$ are really necessary for showing that $A\|I$ is unsatisfiable. For correctness of the simp procedure, it is only necessary that some such D be returned when $\text{unsat}(A\|I)$ returns true. For smaller I, if some such D is returned, it can make the procedure simp more efficient, but it is not necessary for correctness.

For the procedure sat, the recursive calls to sat can be replaced by an arbitrary satisfiability procedure for Boolean formulae, involving when required calls to simp followed by a satisfiability test.

The overall procedure according to the invention for simplifying a quantified Boolean formula F according to the invention is to find a sub-formula A of F or of a formula F' equivalent to F to which the procedure simp or sat can be applied. Such a formula A is then replaced by A', A' being simp(A) or sat(A) in F to obtain a simpler formula F" equivalent to F. This replacement module is illustrated in FIG. 3. This procedure can be repeated on F" in turn any number of times as illustrated in FIG. 6, until one obtains a formula that can be tested for satisfiability or tautology by some other means, or else one may obtain simply true or false.

An example of the operation of the procedure simp is next given. Suppose that. A is the formula $(Ez)((x \vee y \vee z) \vee (x \vee y \vee \neg z) \wedge ((\neg x \vee \neg y \vee z) \wedge (\neg x \vee \neg y \vee \neg z))$. Thus Y is the list x,y of variables. When simp(A,I) is called with I equal to $\{\ \}$, the empty set, notice is first taken that $A\|I$ is not unsatisfiable, nor is it a tautology. (I interpreted as a conjunction is true, so that $A\|I$ is equivalent to A, which is neither a tautology nor unsatisfiable.) The next step is to pick a variable in Y, say x, and call simp(A,$\{x\}$). This in turn will find that $A\|x$ is not unsatisfiable, nor is $A\|x$ a tautology. The formula $A\|x$ is obtained by replacing x by true and simplifying; this yields $(Ez)((\text{true} \vee y \vee z) \wedge (\text{true} \vee y \vee \neg z) \wedge (\neg \text{true} \vee \neg y \vee z) \wedge (\neg \text{true} \vee \neg y \vee \neg z))$, which simplifies to $(Ez)((\neg y \vee z) \wedge (\neg y \vee \neg z))$. So the other variable in I, namely y is next picked, and simp(A, $\{x,y\}$) is called. $A\|\{x,y\}$ is now found to be unsatisfiable. The next task is to find a subset D of $\{x,y\}$ such that $A\|D$ is unsatisfiable; in this case, the only subset that works is $\{x,y\}$. Thus $\{-x,-y\}$ (representing the clause $(-x \vee -y)$) is returned as the value of simp(A,$\{x,y\}$). Now simp(A,$\{x,-y\}$) is called. $A\|\{x,-y\}$ is found to be satisfiable. Also, $A\|\{x,-y\}$ is true, which is a tautology. Thus, true is returned. The call to simp(A,$\{x\}$) then returns the conjunction of these results, which is $(-x \vee -y) \wedge \text{true}$, or, $(-x \vee -y)$. Now simp(A, $\{-x\}$) is called which in turn will call simp(A,$\{-x,y\}$) and simp(A,$\{-x,-y\}$). The former returns true, and the latter returns $\{x,y\}$, representing the clause $(x \vee y)$. Thus the call to simp(A,$\{-x\}$) returns the conjunction of these results, which is $(x \vee y)$. Finally, the call to simp(A,$\{\ \}$) returns the conjunction of $(-x \vee -y)$ and $(x \vee y)$, which is $(-x \vee -y) \wedge (x \vee y)$. It is indeed true that $(-x \vee -y) \wedge (x \vee y)$ is equivalent to $(Ez)((x \vee y \vee z) \wedge (x \vee y \vee \neg z) \wedge (\neg x \vee \neg y \vee z) \wedge (\neg x \vee \neg y \vee \neg z))$.

Even if there is a small formula B equivalent to A which has fewer occurrences of quantifiers, the procedures simp and sat may not find it. In such cases, the formula replacement module can accept user input of a formula B to be used to replace A. When this is done, it is also helpful for the user to provide a verification of the Boolean formula A==B expessing the equivalence of A and B, or else to show that the formulae A==B is a tautology by a recursive application of the simplification module.

Quantifiers are permitted to be rearranged by the formula transformation module as shown in FIG. 2 in order to permit such simplifications to take place. There are many ways in which a formula can be transformed, and the choice is made by the user of the invention method in most cases. For example, if F has a subformula of the form $(EX)(A_1 \text{ op } A_2)$ where "op" is either conjunction or disjunction and $A_1$ and $A_2$ are Boolean formulae, and $A_1$ does not contain any occurrences of X, then the subformula $(EX)(A_1 \text{ op } A_2)$ is equivalent to $(A_1 \text{ op } (EX)A_2)$, and thus the subformula $(EX)A_2$ can be simplified if it does not contain quantifiers and the subformula $(EX)(A_1 \text{ op } A_2)$ of B can be replaced by $(A_1 \text{ op } A_3)$ where $A_3$ is $\text{simp}((EX)A_2)$. For formulae of the form $(A_1 \text{ op } A_2 \text{ op } \ldots \text{ op } A_1)$, where "op" is either conjunction or disjunction, $(EX)(A_1 \text{ op } A_2 \text{ op } \ldots \text{ op } A_n)$ can first be rearranged to $(EX)(B_1 \text{ op } B_2)$ where $B_1$ is a conjunction or disjunction of all the $A_i$ that do not contain the variables X and $B_2$ is a conjunction or disjunction of all the $A_i$ that do contain X. Then the formula $(EX)(A_1 \text{ op } A_2 \text{ op } \ldots \text{ op } A_n)$ is equivalent to $(B_1 \text{ op } (EX)B_2)$, and thus $(EX)B_2$ can be simplified if $B_2$ has no quantifiers. In this way, the subformula $(EX)(A_1 \text{ op } A_2 \text{ op } \ldots \text{ op } A_n)$ of a formula F can be replaced by $(B_1 \text{ op } B_3)$ where $B_3$ is $\text{simp}((EX)B_2)$.

Quantifiers can also be rearranged to obtain subformulae of the desired form. If Z is a set of variables consisting of X and Y together in some order, and X and Y are disjoint, then the formula (EZ)A is equivalent to (EY)(EX)A. Thus if A' is simp((EX)A), the formula (EZ)A is equivalent to (EY)A'.

Suppose the procedure simp or sat is testing a subformula of the form $(Ex)(Ey)(B(x,z) \wedge C(y,z))$ where z is the only free variable. A partial interpretation I may assign a truth-value to z, say, true. This formula A then becomes $(Ex)(Ey)(B(x,\text{true}) \wedge C(y,\text{true}))$. Such a formula will be given to the procedure unsat. However, this formula can first be rearranged in an equivalence-preserving way to obtain the formula $(Ex)B(x,\text{true}) \wedge (Ey)C(y,\text{true})$. This formula consists of the two subformulae $(Ex)B(x,\text{true})$ and $(Ey)C(y,\text{true})$ which do not share free variables. Thus unsat can be more efficient by testing satisfiability of these two subformulae separately and combining the results.

The methodology of the invention also makes use of a formula decomposition module which detects when a formula can be processed more efficiently by expressing it in terms of two other formulae not sharing free variables. In most cases, the recognition of such decompositions must be done by the user. In the procedures unsat and taut called by simp and sat, it is possible to test satisfiability or tautology of formulae of the form $(B_1 \text{ op } B_2)$, where $B_1$ and $B_2$ have no free variables in common and "op" is either conjunction or disjunction, by testing satisfiability of $B_1$ and $B_2$ separately and combining the results. Thus $(B_1 \wedge B_2)$ is satisfiable if both $B_i$ are, and $(B_1 \vee B_2)$ is satisfiable if either $B_i$ is. This can be incorporated into the simp and sat procedures to improve their efficiency. It is possible for the user of the sat and simp procedures to specify how such partitioning should take place: If B is a conjunction or disjunction of many formulae $C_i$, then the order of these subformulae may have to be rearranged in order to permit such a partitioning to take place. For this, the user can give some guidance as to two sets of variables that do not occur together in any formula $C_i$, and this can be used to reorder the formula into the form $(B_1$ op $B_2$) where each $B_i$ is a conjunction or disjunction of many $C_j$, and $B_1$ and $B_2$ do not share free variables. The same technique can be applied if a formula is $(C_1 \text{ op } C_2 \text{ op } \ldots \text{ op } C_n)$ where "op" is either exclusive or or equivalence, since these operators, like conjunction and disjunction, are associative and cornmutative. Thus the user can obtain a formula of the form $(B_1 \text{ op } B_2)$ where $B_1$ and $B_2$ do not share free variables. Then if "op" is exclusive or, $(B_1 \text{ op } B_2)$ is satisfiable unless both $B_i$ are tautologies or both $B_i$ are contradictions. If "op" is equivalence, then $(B_1 \text{ op } B_2)$ is satisfiable unless $B_1$ is a tautology and $B_2$ is a contradiction, or $B_1$ is a contradiction and $B_2$ is a tautology. These conditions can often be tested for faster than by performing a direct satisfiability test on the formula $(B_1 \text{ op } B_2)$.

The general method by which the formula decomposition module works is as follows: To test a quantified Boolean formula H for a logical property P, P being either satisfiability or falsifiability, H is first expressed as a Boolean combination of a collection $Q_H$ of subformulae of H, where subformulae in $Q_H$ do not share free variables. Then a test for each formula in $Q_H$ is specified, said test consisting of a test for satisfiability or falsifiablity or both, in such a way that the results of this testing are sufficient to determine whether H has property P. For example, if H is $B_1 \vee B_2$, $B_1$ and $B_2$ not sharing free variables, and property P is satisfiability, then $Q_H$ consists of the collection containing $B_1$ and $B_2$, and it is specified that both $B_1$ and $B_2$ will be tested for satisfiability in order to determine whether H has property P. Next, the specified tests for formulae in $Q_H$ are carried out, with tests omitted whose results are unnecessary for determining whether H has property P. For example, it is not necessary to test whether $B_2$ is satisfiable if $B_1$ is found to be satisfiable because H is satisfiable regardless of the outcome of the test whether $B_2$ is satisfiable. The results of said testing are next stored in a storage medium of a computer system, and from these results, it is determined whether the quantified Boolean formula H has property P.

Such decompositions can also make the computation of D more efficient in the procedure simp. Let cons($B_1 \vee B_2$, I) be a procedure that returns D a subset of I such that B$\|$D is unsatisfiable, if such a D exists, where B is a quantified Boolean formula and I is an interpretation. Suppose the formulae $B_1$ and $B_2$ share no free variables. Then cons($B_1 \wedge B_2$,I) can be defined as cons($B_1$,I) if $B\_1\|$I is unsatisfiable and cons($B_2$,I) if $B_2\|$I is unsatisfiable. Also, cons($B_1 \vee B_2$, I) can be defined as the union of cons($B_1$,I) and cons($B_2$,I), if $B_1\|$I and $B_2\|$I are both unsatisfiable. Likewise, cons($B_1$==$B_2$,I) can be defined as cons($B_1$,I) U cons(not($B_2$),I), if $B_1\|$I and not($B_2$)$\|$I are both unsatisfiable. It can be defined as cons(not($B_1$),I) U cons($B_2$,I) if not($B_1$)$\|$I and $B_2\|$I are both unsatisfiable. Finally, cons($B_1$+$B_2$) can be defined as cons ($B_1$==not($B_2$)).

The formula transformation module can make use of a definition introduction module to aid in preprocessing F to prepare it for the subformula replacement module. This module introduces new Boolean variables and their definitions to make the procedures sat and simp more efficient. Such variables and definitions will be input by the user. Let B be a subformula of a formula equivalent to F, said formula B corresponding to one or more objects of said system S or parts of the constraints of said system S, or both. Suppose one wants to simplify the formula B having free variables Y. Let R be a collection (sequence) of definitions of new Boolean variables of the form z==(x op y) where "op" is a binary Boolean operation. Let X be the Boolean variables defined in this way. Suppose that each x and y used in such definitions is either a variable in Y or was defined by previous definitions in R. Then B is satisfiable if (EX)(B$\wedge$R) is satisfiable. However, it can happen that simp will return a much smaller formula on (EX)(B$\wedge$R) than on B because the newly defined variables z can lead to a more compact formula. Thus the user can specify such a set R of definitions in order to make simp and sat faster and return smaller results, in some cases. This may also require that the user specify restrictions on the order in which the variables are placed into I in the procedures simp and sat, so the user should be given the ability to specify an ordering of the variables in the procedures simp and sat for this purpose.

The general method by which the definition introduction module works is as follows: First, the formula F is transformed into an equivalent formula providing one or more subformulae. Next, a collection X of Boolean variables not occurring in said equivalent formula is chosen. Then a subformula B of said equivalent formula is chosen, and definitions R of said collection of Boolean variables X in terms of free variables in said subformula B are conjoined to said subformula B. Existential quantifiers (EX) of said collection of Boolean variables are added to the beginning of said conjunction R$\wedge$B. The resulting subformula (EX)(B$\wedge$R) is taken to be A, and said equivalent formula, with A replacing B, is taken to be F'.

An example where definitions of new Boolean variables help is in expressing that one binary integer is equal to the sum of two others. This is difficult to do in a small Boolean formula, especially in clause form, but it becomes easy if the user defines the carry bits, which can be done using additional definitions as specified above and which can be chosen by the user with the benefit of the teachings of the invention.

The polarity of a subformula A in a formula F' tells how the truth of A influences the truth of F'. If the polarity is 1, then if A is replaced by a formula that is "more true," F'becomes "more true." If the polarity is −1, then replacing A by a formula that is "more true" makes F "less true." If the polarity is 0, then the effect of replacing A is uncertain, unless A is replaced by an equivalent formula A', in which case F is equivalent to the resulting formula. By taking into account polarity, the user can permit subformulae of F'to be replaced by formulae that are "more true" or "less true" and still know what the effect will be on the truth of F'.

The subformula replacement module need not always replace a subformula by an equivalent one. One can still obtain information about a Boolean formula when subformulae are replaced by non-equivalent formulae. For this, it is necessary to define the polarity of a subformula occurrence in a formula. The polarity of A and B in the formula A$\wedge$B is 1. The polarity of A and B in the formula A$\vee$B is 1. The polarity of A and B in the formulae A+B and A==B is zero. The polarity of A in the formula not(A) is −1. The polarity of A in (EX)A is 1. If C is a formula occurrence in B, and "op" is a binary Boolean operator, then the polarity of C in (A op B) is equal to the product of the polarity of B in (A op B) and the polarity of C in B. If C is a formula occurrence in A, then the polarity of C in (A op B) is the product of the polarity of A in (A op B) and the polarity of C in A. Finally, if C is a formula occurrence in not(A), then the polarity of C in not(A) is the negative of the polarity of C in A. Thus x has polarity 1 in not(not(x)), polarity −1 in not(x$\vee$y), and polarity 1 in not(not(x)$\vee$not(y)).

Now, suppose that F' is a quantified Boolean formula having a subformula A of polarity 1 in F'. Suppose A is replaced by a formula A' such that A logically implies A', yielding a formula F". Then F' logically implies F". Thus if F" is unsatisfiable, so is F'. If F" is not a tautology, then neither is F'. Thus one can gain information about F from F'. Extending this idea, suppose that G' is obtained from G by a sequence of simplifications of subformulae together with (a) replacements of subformulae A of polarity 1 in G by formulae A' such that A logically implies A'; (b) replacements of subformulae A of polarity −1 in G by formulae A' such that A' logically implies A; and (c) replacements of subformulae A of arbitrary polarity by equivalent formulae A'. Then G logically implies G'. Thus if G' is unsatisfiable, so is G. If G' is not a tautology, then neither is G. This approach can be used to show that G is unsatisfiable, or that G is not a tautology.

Likewise, suppose that G' is obtained from G by a sequence of simplifications of subformulae together with (a) replacements of subformulae A of polarity −1 in G by formulae A' such that A logically implies A'; and (b) replacements of subformulae A of polarity 1 in G by formulae A' such that A' logically implies A; and (c) replacements of subformulae A of arbitrary polarity by equivalent formulae A'. Then G' logically implies G. Thus if G' is a tautology, so is G. If G' is satisfiable, so is G. This approach can be used to show that G is satisfiable, or that G is a tautology.

The general approach for using polarity in the method of this invention is as follows: A quantified Boolean formula G is obtained from the system S and its specification. A collection $Q_S$ of quantified Boolean formulae is created, starting from G. Each formula in $Q_S$ is created from the previously created formula in $Q_S$ so that the same logical relationship R holds between all such pairs of formulae; this relationship can be equivalence, implication, or reverse implication, If said relationship is equivalence, then each formula in $Q_S$ is equivalent to the next created formula in $Q_S$, and G is equivalent to all formulae in $Q_S$, including the last created formula in $Q_S$. If said relationship is logical implication, then each formula in $Q_S$ logically implies the next created formula in $Q_S$, and G logically implies all formulae in $Q_S$ including the last created formula in $Q_S$. If said relationship is reverse implication, then each formula in $Q_S$ is logically implied by the next created formula in $Q_S$, and all formulae in $Q_S$ including the last created formula in $Q_S$ logically imply G. These logical relationships between G and the last created quantified Boolean formula in $Q_S$ can then be used to provide a response indicative of whether the system S satisfies predetermined constraints. In particular, a response will be given whose correctness is a logical consequence of the relationship between G and said last created formula in $Q_S$.

Polarity can be used to choose a formula A' so that the logical relationship R holds between each formula F and the next created formula F" in $Q_S$. For example, if A has polarity one in F' and R is logical implication, then A' should be chosen so that A logically implies A' in order to guarantee that F logically implies F". Other cases can be handled in a similar manner, as indicated in the preceding description of polarity.

The polarity approach has the advantage of flexibility; it can make use of formulae that are not necessarily equivalent to those they replace, but rather that logically imply them, or are implied by them. Such formulae are input by the user, who must either supply proofs that they imply or are implied by the subformulae they replace, or must call the formula simplification module recursively to show this. The user can verify that a formula A logically implies A' by showing that the formula (A∧not(A')) is unsatisfiable, or that the formula (not(A)∨A') is a tautology.

Verifications. It is useful not only to have a procedure return an answer, but also to give a justification for it so that the user can be easily convinced that the result is correct. For example, the user can verify that the formula (x or y) and (x or not(y)) is satisfiable by giving a partial interpretation I satisfying the formula, that is, the interpretation replacing x by true. If the user replaces x by true in this formula, the user obtains (true or y) and (true or not(y)), which simplifies to true. Such an interpretation I can be given to the user who can verify that it satisfies the formula. Without such an interpretation, it can be difficult for the user to check that a formula is satisfiable, because there can be very many interpretations to examine to see if one of them works.

Figure 7:
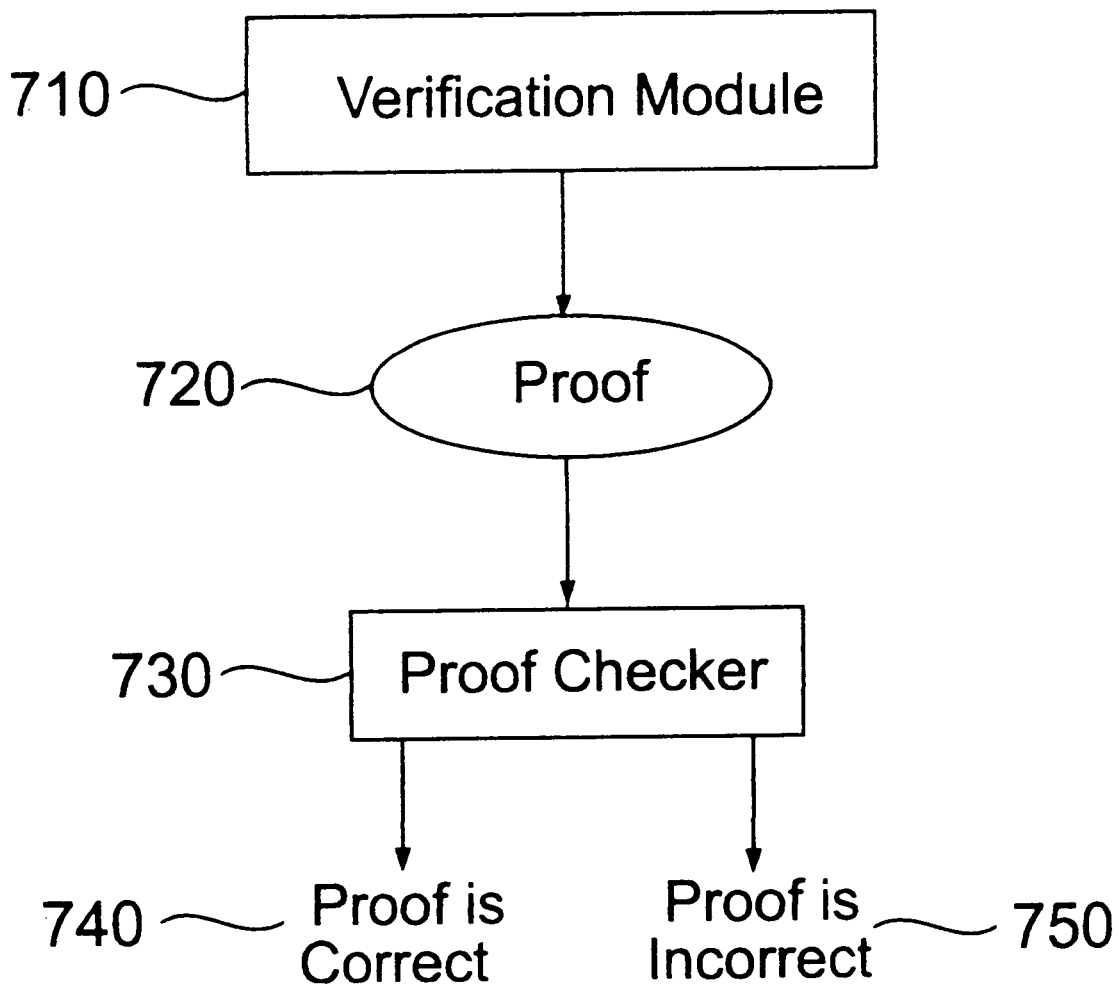
FIG. 7 is a flow diagram of the verification module of the present invention.

It is useful to print out a verification of the results of the programs simp and sat, to gain added confidence in the correctness of their output. For this, the invention provides a verification module. This consists in modified versions of simp and sat, as well as a proof checking module for checking the correctness of the proofs printed out. The user can check that the verification is correct and thus have confidence in the result even without knowing for sure that the program is free of errors. The verification module is illustrated in FIG. 7. This is especially important for hardware and system verification, where errors can be costly. The procedures simp(A,{ }) and sat(A) can be modified so that they will print out a verification that A is satisfiable, if this is so, and that A is unsatisfiable, if this is so. For this there are the following inference rules in which the proofs will be expressed:

If A∥y is satisfiable for a literal y then A is satisfiable.

If A∥y and A∥not(y) are unsatisfiable for a Boolean variable y then A is unsatisfiable.

true is satisfiable.

false is unsatisfiable.

(A satisfiable) and ((EX)A has no free variables) imply ((EX)A==true).

(A unsatisfiable) and ((EX)A has no free variables) imply ((EX)A==false).

(AX)B is satisfiable if and only if not(EX)not(B) is satisfiable.

(B∥(I U {y}) implies A∥(I U {y})) and (C∥(I U {not(y)}) implies A∥(I U {not(y)}) imply ((B∧C)∥I implies A∥I))

(A implies B) and (A implies C) imply (A implies (B∧C))

(A implies B) and (B implies A) imply (A==B)

(A implies B) and (A satisfiable) implies (B satisfiable)

(A implies B) and (B unsatisfiable) implies (A unsatisfiable)

(A==B) and (A satisfiable) imply (B satisfiable)

(A==B) and (A unsatisfiable) imply (B unsatisfiable)

(A==B) imply (B==A)

These rules also print out proofs of equivalence of the original and simplified formulae. For purposes of output, and to distinguish the value of A∥y from the expression denoting it, Replace(A,y,B) is used to mean that A∥y is B, in this way representing the first two above inference rules as follows:

Replace(A,y,B) and (B satisfiable) imply (A satisfiable).

Replace(A,y,B) and Replace(A,not(y),C) and (B unsatisfiable) and (C unsatisfiable) imply (A unsatisfiable).

The user will not always do this transformation explicitly, for convenience. A proof of a statement using this system consists of proofs of the statements 1, 2, . . . , n in some order followed by a statement of the form 1 and 2 and . . . and n imply. Also, an axiom by itself is a proof of itself. Such a proof will be output if the procedures simp and sat are modified as follows:

First, the procedures unsat and taut must be modified to print out verifications of their conclusions in the same proof system. Second, the procedure simp has to be modified as follows:

procedure simp(A,I)
  if unsat(A∥I)=true then let D={$d_1, d_2, \ldots, d_n$}
    be a subset of I such that (A∥D) is unsatisfiable;
    let C be not($d_1$)∨not($d_2$)∨ ... ∨not($d_n$);
    print(A implies C);
    print(Replace(C,I,C∥I) and Replace(A,I,A∥I) imply (C∥I implies A∥I));
    return(C)
  else if taut(A∥I)=true then return true
  else [for some free variable y in A, neither y nor not(y) occurs in I]
    let y be some free variable in A such that neither y nor not(y) occurs in I;
    let $A_1$ be simp(A, I U {y});
    let B be A∥I;
    let $A_2$ be simp(A, I U {not(y)});
    if B∥y is satisfiable then print(Replace(B,y,B∥y) and B∥y satisfiable imply B satisfiable) else
    if B∥not(y) is satisfiable then print(Replace(B,not(y), B∥not(y)) and B∥not(y) satisfiable imply B satisfiable)
    else print(Replace(B,y,B∥y) and B∥y unsatisfiable and Replace(B,not(y),B∥not(y)) and B∥not(y) unsatisfiable imply B unsatisfiable) fi fi fi;
    print(Replace(B,y,B∥y) and Replace(B,not(y),B∥not(y)) and ($A_1$∥(I U {y}) implies B∥y) and ($A_2$∥(I U {not(y)}) implies B∥not(y)) imply (($A_1 \wedge A_2$)∥I implies B));
    print((A implies $A_1$) and (A implies $A_2$) imply (A implies ($A_1 \wedge A_2$)));
    if I is empty then print(($A_1 \wedge A_2$) implies A) and (A implies ($A_1 \wedge A_2$)) imply (A==($A_1 \wedge A_2$)));
    return ($A_1 \wedge A_2$)
  fi fi fi
end simp;

This procedure lacks some of the optimizations of the original simp procedure, for the sake of simplicity. The tests for whether B∥y is satisfiable and whether B∥not(y) is satisfiable do not have to be answered by a direct computation, but can be answered by looking at the proof printed so far to see whether it contains a statement that B∥y is satisfiable or not and whether it contains a statement that B∥not(y) is satisfiable or not.

In a similar way, the procedure sat must be modified as follows, to print out verifications:

procedure sat((EY)B)
  if unsat(B)=true then print(B unsatisfiable and (EY)B has no free variables imply (EY)B==false); return false
  else if unsat(B)=false then print(B satisfiable and (EY)B has no free variables imply (EY)B==true); return true
  else [there is a free variable y in Y in the formula B]
    let y be some free variable in the formula B;
    let $B_1$ be sat((EY)(B∥y));
    if $B_1$ is true then
      print(Replace(B,y,B∥y) and B∥y satisfiable imply B satisfiable);
      print((B satisfiable) implies (EY)B==true);
      return true fi;
    let $B_2$ be sat((EY)(B∥{not(y)}));
    if $B_2$ is true then
      print(Replace(B,not(y),B∥not(y)) and B∥not(y) satisfiable
      imply B satisfiable);
      print((B satisfiable) implies (EY)B==true);
      return true fi;
    print(Replace(B,y,B∥y) and B∥y unsatisfiable and Replace(B,not(y),B∥not(y)) and B∥not(y) unsatisfiable imply
      B unsatisfiable);
    print((B unsatisfiable) implies (EY)B==false);
    return false
  fi fi
end sat;

It is also necessary to print out verifications of satisfiability or unsatisfiability of the original formula G if it is transformed by a sequence of replacements of subformulae into true or false. For this, it suffices to use the inference rules stating that if two formulae are equivalent and one of them is satisfiable, then so is the other one, and similarly for unsatisfiability. In this way, and with a few more such print statements and inference rules, a proof of satisfiability or unsatisfiability of G can be obtained. This method can also produce such verifications when subformulae of G are replaced by non-equvalent formulae as mentioed above. A dual method can provide a proof that G is or is not a tautology; another possibility for this is to note that G is a tautology if and only if not(G) is unsatisfiable. Finally, from the proof that G is satisfiable, an interpretation I satisfying G can be extracted if desired; such an interpretation can be useful for identifying errors in a circuit or system.

The general method by which the verification module works is as follows: First, a collection of assertions and inferences concerning the formula G obtained from the system S and its constraints, and other formulae in the collection $Q_S$, is created, and representations thereof are stored in a storage medium of a computer system. Also, a logical property of the formula G is created; this can be that G is satisfiable, unsatisfiable, falsifiable, or not falsifiable. Said logical property can also be that G is satisfied or falsified by a particular interpretation of the free variables of said formula G. Next, said logical property of G is verified by verifying that said collection of assertions and inferences constitute a proof of said logical property of G, making reference to representations thereof stored in said computer system. Finally, based on this verification, a response is inferred and provided indicative of whether said system S satisfies certain predetermined constraints.

EXAMPLES

The following examples show how the method of the present invention applies to formulae that are sets of clauses, that is, conjunctions of disjunctions of literals. Suppose F is a set (conjunction) of clauses and it is desired to test F for satisfiability. First, one expresses F as (EX)F where X includes all of the Boolean variables in F; then F is satisfiable iff (EX)F is a tautology. Then one chooses some subset Z of the variables X to eliminate. One expresses (EX)F as (EY)(EZ)F where Y is the rest of X. Then one splits F into two parts, $F_1$ and $F_2$, wherhe $F_1$ is a conjunction of clauses that do not contain any of the variables Z, and $F_2$ is a conjunction of clauses, some or all of which do contain one or more of the variables Z. Then one expresses F as (EY)(EZ)($F_1$[Y]∧$F_2$[Z,Y]). One rearranges quantifiers to obtain (EY)($F_1$[Y]∧(EZ)($F_2$[Z,Y])). Thus F' is the formula (EY)($F_1$[Y]∧(EZ)($F_2$[Z,Y])), which is equivalent to F. One then selects the subformula A of F' as the formula (EZ)($F_2$[Z,Y]). Next one lets A' be simp((EZ)($F_2$[Z,Y])). Then (EX)F has been simplified to (EY)($F_1$[Y]∧A'). Thus the variables in Z have been eliminated. This procedure can be applied to this simplified formula in turn, and this can be continued until all variables have been eliminated from F, and the user obtains either true or false, the former indicating satisfiability and the latter indicating unsatisfiability of F. There are some test results in which a method similar to this one is much faster than Davis and Putnam's method.

The following example shows how the user can apply the method of the invention to clause form formulae in general, and to clause form formulae obtained from circuits having certain special forms. For the present invention, the question remains as to how the variables Z are chosen in this application. There are a number of possibilities, and which one is chosen by the user is facilitated by the teachings of the invention as described herein. One method that sometimes works well is the following: Define N(Z) for a set Z of variables to be the set of variables x such that for some z in Z, x and z (or their complements) occur in a common clause. The set N(Z) wil be referred to as the neighbors of Z. The user specifies an integer n and at each stage, the largest non-empty set Z of variables is chosen such that N(Z) has n or fewer elements. If no such set exists, then Z is set to $\{z\}$ for some variable z such that $N(\{z\})$ has a minimal number of elements. Once Z has been chosen, F', A, and A' can be chosen as indicated above. The formula A represents part of the system S and the specification of said system S.

The above method may take a long time to compute, and it can be approximated more efficiently according to the present invention as follows: First, one chooses Z to be the set $\{x\}$ where x is a variable such that $N(\{x\})$ has a minimal number of elements. Then one continually adds variables y to Z as long as N(Z) is not empty and some such y can be found such that $N(Z \cup \{y\})$ is not greater than n, and in this case some such y such that $N(Z \cup \{y\})$ is of minimal size is added to Z.

After such a collection Z of variables has been found, then, as indicated above, the subformula A can be chosen to consist of existential quantifiers of all variables in Z, followed by a conjunction of clauses containing all clauses mentioning variables in Z, and F' can be chosen to be a formula equivalent to F having such a subformula A.

Figure 12:
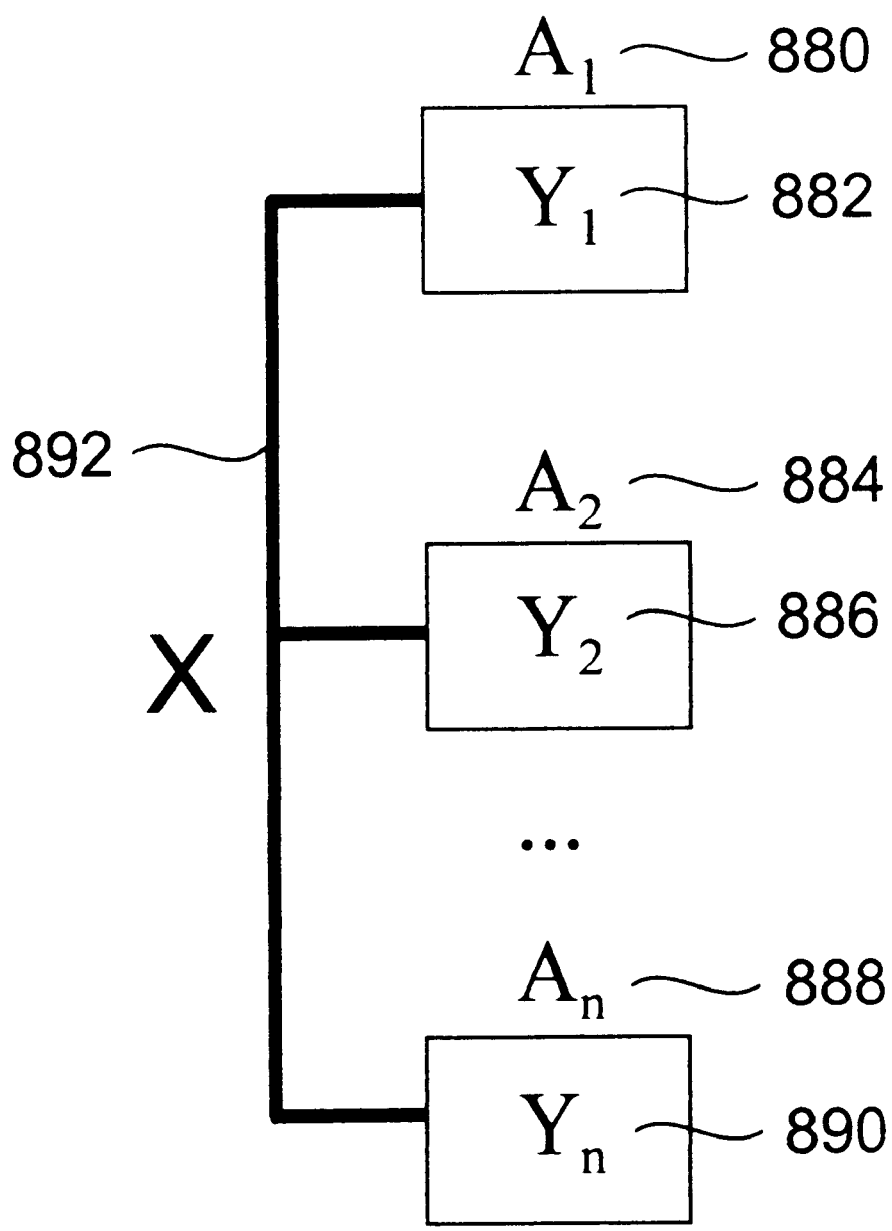
FIG. 12 is a diagram of a modular circuit.

If the formula F is modular, another method for choosing the variables Z to eliminate may be used. A formula F is modular if F is of the form $A_1(X,Y_1) \wedge A_2(X,Y_2) \wedge \cdots \wedge A_n(X,Y_n)$. Such a formula represents a modular system, which has a collection of modules, each module having common external objects, represented by the variables X, and unique internal objects, represented by the variables $Y_i$. This can be the case if F represents a circuit and each $A_i$ represents a component, with the variables $Y_i$ representing the internals of component i and X representing input-output and communication between the components. Such a circuit is illustrated in FIG. 12. The modules are $A_1$ 880, $A_2$ 884, and $A_n$ 888 and their internal objects are 882, 886, and 890, respectively. The common external objects are 892. The formulae $A_i$ may also include the specification of the component i or of the whole circuit. Then the variables $Y_1, \ldots, Y_n$ can be eliminated in turn to produce a formula B of the form $A'_1(X) \wedge A'_2(X) \wedge \cdots \wedge A'_n(X)$ equivalent to F but having fewer variables. The elimination of the variables $Y_i$ involves choosing the subformula A of F' to be a collection of existential quantifiers mentioning the variables in $Y_i$ (corresponding to internal objects of module i) followed by another subformula consisting of all clauses mentioning the variables $Y_i$, with other variables in said clauses being free. The formula B may be decided by a further application of the same method, or by a direct call to some other satisfiability procedure such as Davis and Putnam's method.

Figure 13:
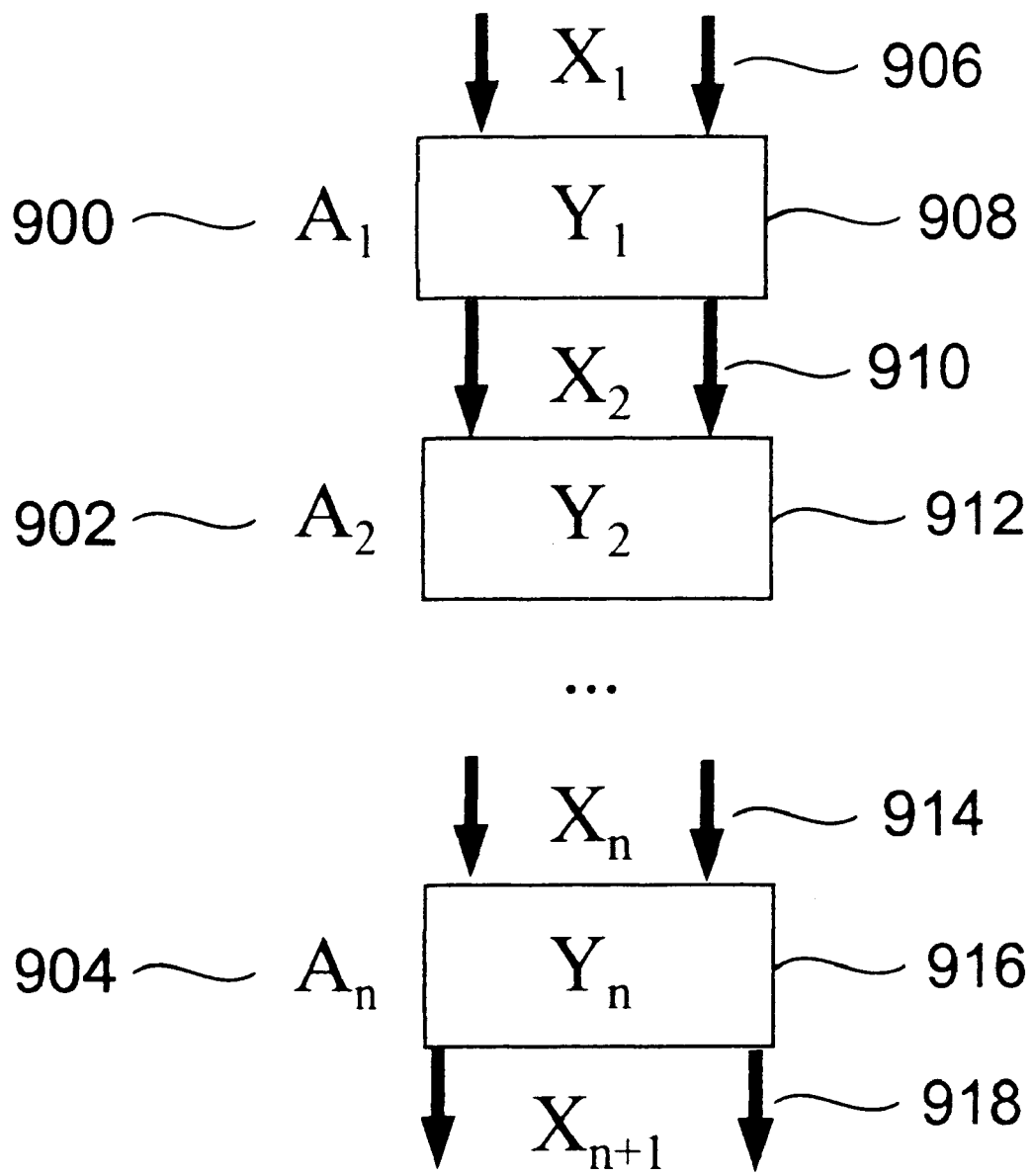
FIG. 13 is a diagram of a staged circuit.

Another method for choosing variables to eliminate can be used if the formula represents a circuit that operates in stages, the output of one stage being used as the input to the next. A staged circuit is illustrated in FIG. 13. The stages are 900, 902, 904 and their internal objects are 908, 912, and 916. The input to the first stage is 906, the output from the first stage is 910, the input to the last stage is 914, and the output from the last stage is 918. Such a circuit can be represented by a formula F of the form $A_1(X_1,Y_1,X_2) \wedge A_2(X_2,Y_2,X_3) \wedge \cdots \wedge A_n(X_n,Y_n,X_{\{n+1\}}) \wedge B(X_1,X_{\{n+1\}})$. Here $A_i$ represents the i-th stage of the circuit, which has input $X_i$, output $X_{\{i+1\}}$, and variables $Y_i$ representing the internal signals of the circuit. B represents the (negation of the) desired relationship between $X_1$ and $X_{\{n+1\}}$). This circuit can be simplified by letting $A'_1(X_2,X_{\{n+1\}})$ be $simp((EX_1)(EY_1)(A_1(X_1,Y_1,X_2) \wedge B(X_1,X_{\{n+1\}})))$, letting $A'_2(X_3,X_{\{n+1\}})$ be $simp((EX_2)(EY_2)(A_2(X_2,Y_2,X_3) \wedge A'_1(X_2,X_{\{n+1\}})))$, letting $A'_3(X_4,X_{\{n+1\}})$ be $simp((EX_3)(EY_3)(A_3(X_3,Y_3,X_4) \wedge A'_2(X_3,X_{\{n+1\}})))$ etcetera. The whole formula will then be satisfiable iff the formula $A'_n(X_{\{n+1\}}, X_{\{n+1\}})$ is, and this can be tested by calling simp or sat on the formula $(EX_{\{+1\}})$ $(A'_n(X_{\{n+1\}},X_{\{n+1\}}))$. Of course, the elimination of variables can also proceed in the other direction, first eliminating $X_{\{n+1\}}$ and $Y_n$, then $X_n$ and $Y_{\{n-1\}}$, et cetera. One can also eliminate some of the variables in the middle first. The exact order of such eliminations can be chosen by the user.

The following example gives two ways in which the method of the invention can be used to test whether two circuits are equivalent. This is a common test, because it can be useful to know that a new circuit is equivalent to an old and reliable one. This test can be performed by letting the system S be one of the circuits and letting the specification of S assert that this circuit is equivalent to the other circuit.

The user can also apply the procedure simp to testing equivalence of two circuits. Suppose that C[X,Y] is a Boolean formula (typically a set of clauses) which describes the operation of one circuit, where X are the input-output variables and Y are the internal variables. Suppose that D[X,Z] is a formula, typically a set of clauses, which describes the operation of the other circuit. Thus if (EY)C[X,Y] is true, then X are permissible input-output values for the first circuit, and (EZ)D[X,Z] is analogous for the second. Then the circuits are equivalent if the formula (EX)not(((EY)C[X,Y])==((EZ)D[X,Z])) is unsatisfiable. This is a quantified Boolean formula whose satisfiability can be tested as indicated above. The satisfiability of this formula can be tested by repeatedly choosing subformulae A and replacing them by simp(A) until the entire formula is replaced by true or false. For this, note that the variables Y and Z will be in disjoint parts of the formula when all of the variables in X have been replaced by Boolean values, so this can aid in partitioning this formula to make satisfiability testing easier. That is, if I assigns truth values to all variables in X, then (EX)not(((EY)C[X,Y])==((EZ)D[X,Z]))||I is a formula of the form not(((EY)C'[Y])==((EZ)D'[Z])) having the two subformulae C' and D' that do not share free variables. Thus the satisfiability of this formula can be tested by testing separately if C' and D' are satisfiable and combining the results. This can be much more efficient than calling a straightforward satisfiability procedure on the whole formula.

Another approach to testing equivalence of two circuits is as follows: Let the Boolean formula C[X,Y,Z] describe the operation of the first circuit, where X are the input variables, Y are the internal variables, and Z are the output variables. Typically C will be a set of clauses. Let C'[X',Y',Z'] be a similar formula describing the operation of the other circuit. The equivalence of the two formulae on all inputs is described by the unsatisfiability of the formula (EX)(EY)(EZ)(EX')(EY')(EZ')((X==X') $\wedge$ C[X,Y,Z]$\wedge$C[X',Y',Z']$\wedge$not(Z==Z')) where (X==X') means (x_1==x'_1)$\wedge$ ... $\wedge$(x_n==x'_n), and similarly for Z==Z'. This formula has only existential quantifiers, so it can be decided by repeatedly eliminating some of the existential variables. This approach has an advantage in that the elimination of the input variables, the internal variables, and the output variables can proceed in parallel, permitting greater flexibility.

Figure 14:
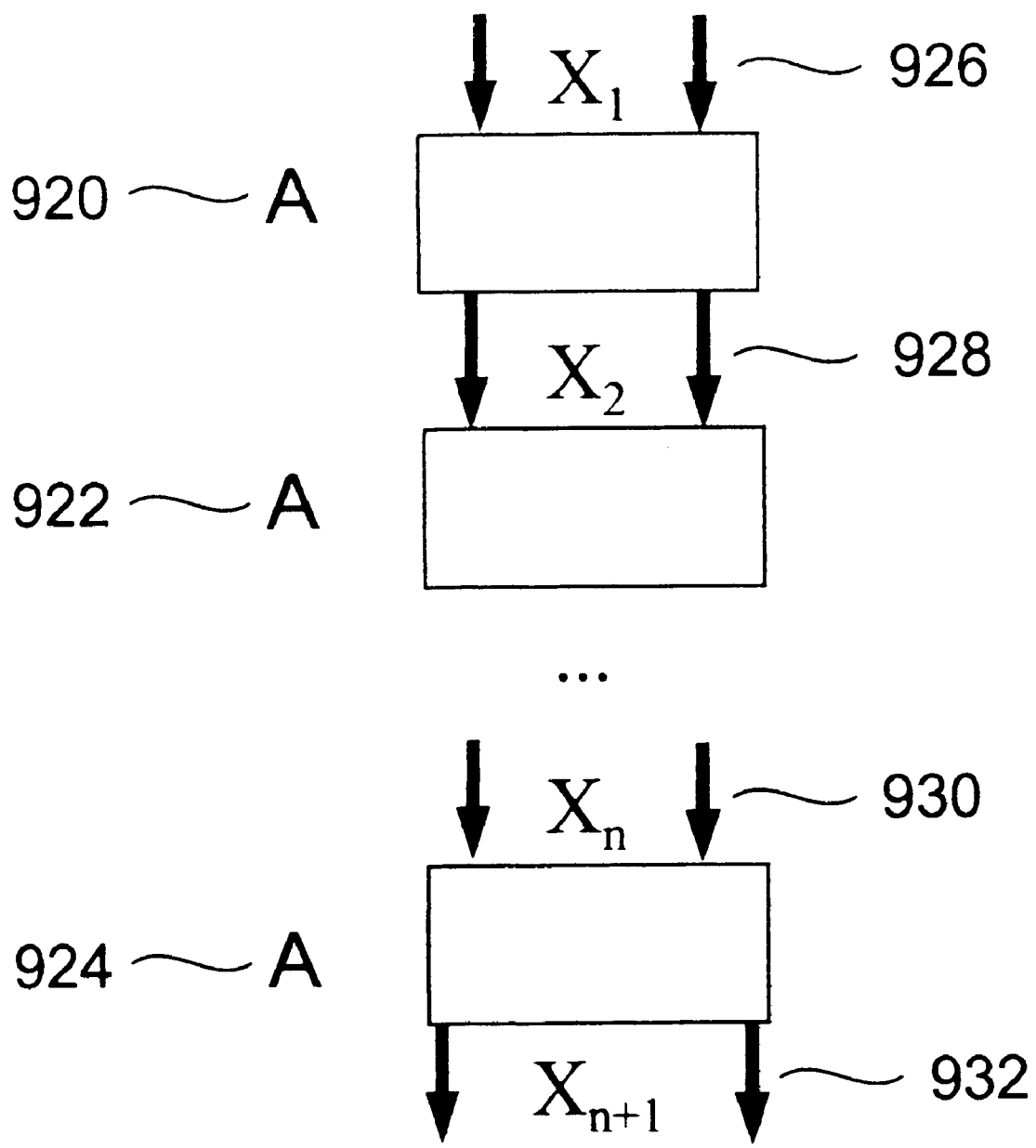
FIG. 14 is a diagram of a repetitive circuit.

The procedures simp and sat can also be used to detect when fixpoints of repetitive systems have been attained. A repetitive formula is a formula of the form $A[X_1,X_2]$ $\wedge A[X_2,X_3]\wedge \ldots \wedge A[X_{\{n-1\}},X_n]$. Such a formula represents a repetitive system, illustrated in FIG. 14, which has a collection of identical modules 920, 922, 924 arranged in a linear order, provided with two collections of external connections 926, 928, 930, 932, the second collection of connections of one module being identified with the first collection of connections of the next module. Typically these two sets of external connections will be inputs and outputs to a module. Let us refer to this formula by $A\wedge n[X_1,X_2,\ldots,X_n]$. The formula A[X,Y] is often of the form (EZ)A'[X,Z,Y] for some formula A'. Such formulae are often encountered in symbolic model checking. For symbolic model checking applications, it is of interest to know for which n the formula $B[X_1]\wedge A\wedge n[X_1,X_2,\ldots,X_n]\wedge C[X_n]$ is unsatisfiable. It is often useful to know that this formula is unsatisfiable for all n. Thus a test is presented that can verify that the formula $B[X_1]\wedge A\wedge n[X_1,X_2,\ldots,X_n]\wedge C[X_n]$ is unsatisfiable for all n.

Let $B\wedge n[X_n]$ be the formula $(EX_1)(EX_2)(EX_3)\ldots(EX_{\{n-1\}})(B[X_1]\wedge A\wedge n[X_1,X_2,\ldots,X_n])$. The user will want to know whether for all n, $B\wedge n[X_n]\wedge C[X_n]$ is unsatisfiable. This is equivalent to the question whether $(B\wedge 1[X]\vee B\wedge 2[X]\vee \ldots \vee B\wedge n[X]\vee \ldots)\wedge C[X]$ is unsatisfiable. The invention method is to find the smallest n such that $B\wedge\{n+1\}[X]$ logically implies $(B\wedge 1[X]\vee B\wedge 2[X]\vee \ldots \vee B\wedge n[X])$; such an n must exist by properties of these formulae. The user tests whether $B\wedge\{n+1\}[X]$ logically implies $(B\wedge 1[X]\vee B\wedge 2[X]\vee \ldots \vee B\wedge n[X])$ by testing whether the formula not(B$\wedge\{n+1\}[X])\vee(B\wedge 1[X]\vee B\wedge 2[X]\vee \ldots \vee B\wedge n[X])$ is valid, that is, whether $(AX)(not(B\wedge\{n+1\}[X])\vee(B\wedge 1[X]\vee B\wedge 2[X]\vee \ldots \vee B\wedge n[X]))$ is a tautology. This is a quantified Boolean formula which can be simplified to true using above methods iff it is a tautology. This formula represents the specification that a repetitive system exhibits no input-output behavior for some number of repetitions of its module which no other repetitive system having said identical modules can exhibit for fewer repetitions of said module, where B may be considered as a constraint on the inputs or outputs to said system. Equivalently, there do not exist values for the first collection of external connections of the first module, said values satisfying the constraint B, which allow values for the second external connections of the last module, so that said values for said second external connections are not allowed for fewer repetitions of said module. When such an n has been found, then the user tests whether $B\wedge j[X]\wedge C[X]$ is satisfiable for any non-negative integer j not larger than n; if not, then the user knows that for all n, $B\wedge n[X]\wedge C[X]$ is unsatisfiable. Otherwise, for some n, $B\wedge n[X]\wedge C[X]$ is satisfiable.

Figure 15:
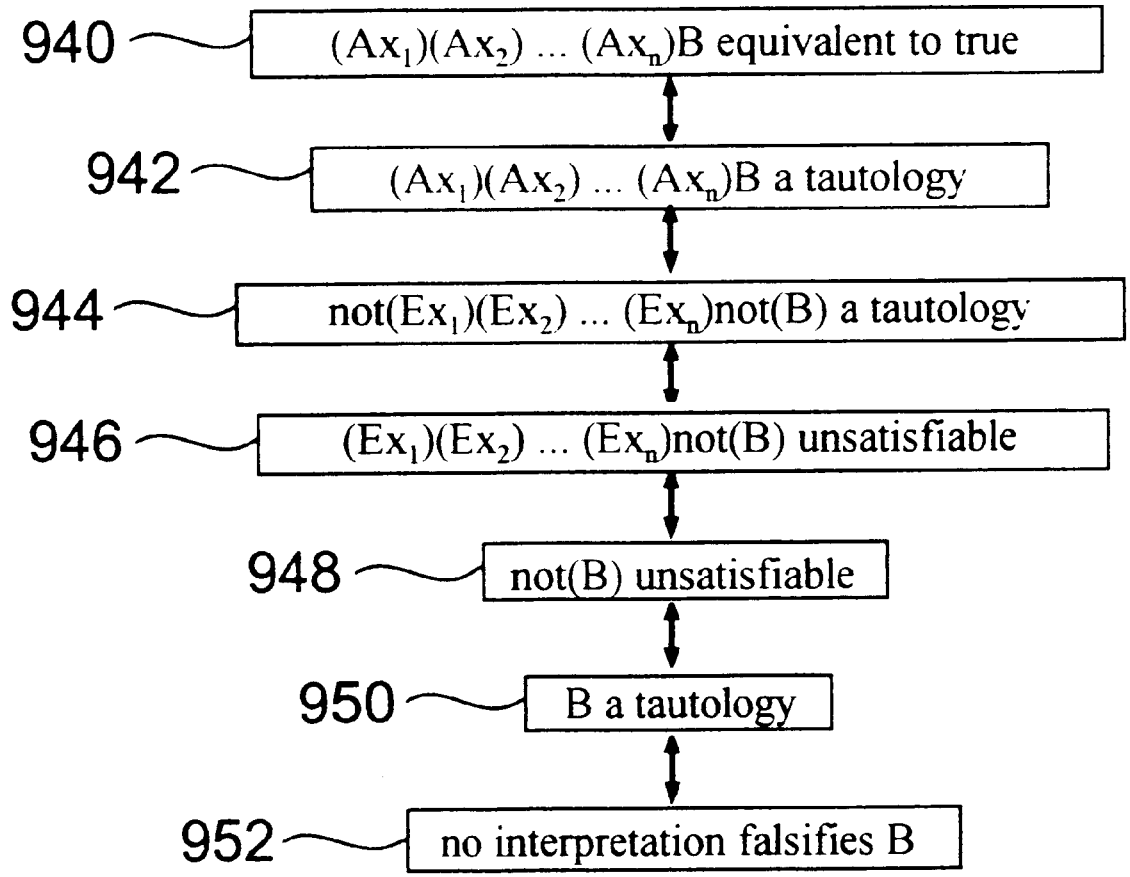
FIG. 15 is a diagram of an example of the use of duality in the present invention.

The method of this invention may also be applied to formulae with free variables considered to be universally quantified instead of existentially quantified, by the principle of duality, illustrated in FIG. 15. If such formulae are in disjunctive normal form, that is, disjunctions of conjunctions of literals, then the above methods of choosing subformulae A may also be used, again by duality. In FIG. 15, 940, 942, 944, 946, 948, 950, and 952 are equivalent statements, where duality is used to show that the statements 942 and 946 are equivalent.

Test Results

Part of this invention has been implemented and tested. This implementation, referred to as sttrim, does not have a formula decomposition module, nor does it make use of arbitrary procedures unsat and taut as in the procedures simp and sat. Both of these features could significantly improve the running times, the latter because the user could use very efficient existing satisfiability testers to improve performance. Regardless, the test results below show that the method of the present invention performs well on those kinds of formulae identified by the invention. The program sato3 (by Hantao Zhang) is a very efficient implementation of Davis and Putnam's method.

The "adder" problems below were obtained from circuits for adders of various sizes. The numbers after the word "adder" indicate the size of the problem, and similarly for the other problems. The "parity" problems were obtained from circuits of various sizes for the parity function. The "arb" problems were obtained from verifying various properties of an arbiter; these are closely related to symbolic model checking, since time is encoded as well as Boolean values. N/A indicates that the respective program could not obtain an answer within a reasonable time, generally about an hour.

On the following problems, sttrim has a slower growth rate than sato3 in essentially every case, and is usually faster. All of these problems are in clause form, and sttrim tests satisfiability by a sequence of eliminations of sets of variables. It is also often found that sttrim is slower than sato3 for formulae that cannot be expressed as staged Boolean formulae in the sense defined above; most of the following cases can be so expressed.

| Problem | sttrim seconds | sato3 seconds |
| --- | --- | --- |
| adder.001 | 0.23 | 0.03 |
| adder.005 | 1.59 | 0.07 |
| adder.010 | 3.13 | 0.14 |
| adder.012 | 3.82 | 0.17 |
| adder.015 | 4.93 | 0.24 |
| adder.018 | 6.20 | 0.30 |
| adder.020 | 7.06 | 0.33 |
| adder.040 | 15.47 | 1.64 |
| adder.080 | 39.55 | 10.45 |
| adder.160 | 121.38 | 96.66 |
| parity.001 | 0.07 | 0.03 |
| parity.005 | 0.38 | 0.03 |
| parity.010 | 1.25 | 0.08 |
| parity.012 | 1.46 | 0.08 |
| parity.015 | 2.21 | 0.13 |
| parity.018 | 2.69 | 0.17 |
| parity.020 | 3.09 | 0.19 |
| parity.021 | 3.33 | 0.21 |

-continued

| Problem | sttrim seconds | sato3 seconds |
|---|---|---|
| parity.022 | 3.41 | 0.25 |
| parity.023 | 3.69 | 0.24 |
| parity.024 | 3.92 | 0.27 |
| parity.025 | 4.05 | 0.29 |
| parity.030 | 5.07 | 0.42 |
| parity.040 | 7.21 | 0.80 |
| parity.080 | 15.83 | N/A |
| parity.160 | 37.02 | N/A |
| arb2.001 | 0.36 | 0.04 |
| arb2.005 | 11.82 | 0.44 |
| arb2.010 | 27.11 | 12.63 |
| arb2.012 | 36.94 | 65.05 |
| arb2.015 | 51.61 | N/A |
| arb2.018 | 62.59 | N/A |
| arb2.020 | 80.08 | N/A |
| arb2.040 | 185.64 | N/A |
| arb2.080 | N/A | N/A |
| arb2.160 | N/A | N/A |
| arb2fp.001 | 0.35 | 0.04 |
| arb2fp.005 | 13.64 | 0.37 |
| arb2fp.010 | 33.17 | 9.75 |
| arb2fp.012 | 44.44 | 44.55 |
| arb2fp.015 | 54.80 | N/A |
| arb2fp.018 | 76.81 | N/A |
| arb2fp.020 | 87.52 | N/A |
| arb2fp.040 | 195.54 | N/A |
| arb2fp.080 | N/A | N/A |
| arb2fp.160 | N/A | N/A |
| arb21p.05:01 | 0.93 | 0.10 |
| arb21p.05:02 | 20.30 | 0.95 |
| arb21p.05:03 | 17.34 | 1.26 |
| arb21p.05:04 | 19.73 | 0.96 |
| arb21p.06:04 | 40.93 | 2.23 |
| arb21p.07:04 | 33.13 | 5.20 |
| arb21p.08:04 | 72.32 | 13.51 |
| arb21p.09:04 | 92.03 | 46.43 |
| arb21p.10:04 | 288.60 | 89.74 |
| arb21p.11:04 | 112.72 | 129.76 |
| arb21p.12:04 | 228.17 | 566.46 |
| arb21p.13:04 | 137.17 | N/A |
| arb21p.14:04 | N/A | N/A |
| arb21p.15:04 | N/A | N/A |
| arb21p.10:01 | 2.10 | 0.22 |
| arb21p.10:02 | 56.88 | 60.34 |
| arb21p.10:03 | 61.75 | 105.02 |
| arb21p.10:04 | 288.60 | 89.74 |
| arb21p.10:05 | 731.57 | 114.16 |
| arb21p.10:06 | 263.16 | 58.60 |
| arb21p.10:07 | 374.15 | 45.66 |
| arb21p.10:08 | 288.01 | 37.26 |

While the invention has been described with reference to specific embodiments thereof, it will be appreciated that numerous variations, modifications, and embodiments are possible, and accordingly, all such variations, modifications, and embodiments are to be regarded within the spirit and scope of the invention.

What is claimed is:

1. In a computer system, a method of verifying that a system S satisfies certain predetermined constraints representing specifications of said system S, wherein said system S comprises a collection of interconnected objects such as found in an electric circuit, and wherein satisfying said constraints signifies proper functioning of said system S, said method comprising the steps of:
   a. providing a representation of the system S and said constraints in a form sufficient to reveal their structure;
   b. creating a quantified Boolean formula identified as G representative of said system S and its constraints;
   c. storing said formula G in a storage medium of said computer system;
   d. making reference to said representation of said system S and its constraints, creating therefrom a collection of quantified Boolean formulae $Q_S$, said collection having at least G contained therein, wherein each subsequent Boolean formula is created from a previously created Boolean formula in said collection $Q_2$ and wherein the additional quantified Boolean formulae in addition to said quantified Boolean formula G are created without selected variables and quantifiers that were contained in the previously created quantified Boolean formula in said collection $Q_S$, said selected variables and quantifiers corresponding to one or more objects and constraints of said system S;
   e. storing the last created formula in said collection of quantified Boolean formulae $Q_s$ in a storage medium of said computer system for further processing;
   f. processing said collection of quantified Boolean formulae $Q_S$ to obtain a result; and
   g. evaluating said result to determine whether said system S satisfies said constraints and signifying thereby whether said system S is capable of functioning according to said specifications.

2. The method of claim 1 further comprising the steps of creating a formula F" from F, wherein F refers to a created quantified Boolean formula in said collection $Q_S$ of quantified Boolean formulae and F" refers to the next created quantified Boolean formula in said collection $Q_S$, by:
   a. when required, transforming said formula F into an equivalent formula F' in a form that provides one or more sub-formulae, otherwise letting F' refer to F;
   b. choosing a desired subformula A of F' by making reference to said representation of the system S, wherein said subformula A of F' represents one or more objects of said system S or parts of said system's constraints, or both;
   c. storing said subformula A of F' in a storage medium of said computer system for further processing;
   d. creating a quantified Boolean formula A' having selected variables and quantifiers contained in A corresponding to one or more objects of said system or parts of said system's constraints removed;
   e. replacing A in F' by said formula A' to obtain said formula F"; and
   f. storing said formula F" in a storage medium of said computer system for further processing.

3. The method of claim 1, wherein the system S is a circuit and the specification of S expresses that said circuit is equivalent to another circuit.

4. The method of claim 1, wherein when the system S is a repetitive system with a number of identical modules arranged in a linear order, further comprising the steps of:
   a. providing each module in said system S with a first and second collection of external connections; and
   b. specifying a relationship between the values of said first and second collection of external connections in each module, and identifying the second connections of one module with the first connections of the next module, and in which the specification of S is the following assertion, or its negation: there exist values for the first collection of external connections of the first module of said system S such that said values satisfy a predetermined constraint, and such that said system S allows values for the second external connections of the last module of said system S which no other repetitive system having fewer numbers of said identical modules allows for said values of said first collection of external connections of said first module.

5. The method of claim 1, wherein providing a response indicative of whether said system S satisfies certain predetermined constraints further comprises the steps of:

a. creating a collection of assertions and inferences concerning said formula G and other quantified Boolean formulae;

b. storing a representation of said collection of assertions and inferences in a storage medium of said computer system;

c. creating a logical property which said formula G may or may not have;

d. verifying that said collection of assertions and inferences constitute a proof that said formula of G has said logical property by making reference to said representation;

e. inferring a response indicative of whether said system S satisfies certain predetermined constraints by using said verification; and f. providing said response.

6. The method of claim 2 further comprising the steps of processing said collection $Q_S$ to provide a response indicative of whether said system S satisfies certain predetermined constraints, wherein R is a logical relationship between quantified Boolean formulae in said collection $Q_S$ of quantified Boolean formulae, by:

a. creating each quantified Boolean formula other than G in said collection $Q_S$ from the immediately previously created quantified Boolean formula in said collection $Q_S$ so that said logical relationship R holds between each quantified Boolean formula in said collection $Q_S$ and the next created quantified Boolean formula in said collection $Q_S$;

b. if said logical relationship R is that the each created quantified Boolean formula in said collection $Q_S$ other than the last created formula in said collection $Q_S$ logically implies the next created quantified Boolean formula in said collection $Q_S$, then providing a response whose correctness is a logical consequence of the assertion that G logically implies the last created quantified Boolean formula in said collection $Q_S$;

c. if said logical relationship R is that each created quantified Boolean formula in said collection $Q_S$ other than G logically implies the immediately previously created quantified Boolean formula in said collection $Q_S$, then providing a response whose correctness is a logical consequence of the assertion that G is logically implied by the last created quantified Boolean formula in said collection $Q_S$; and d. if said logical relationship R is that each created quantified Boolean formula in said collection $Q_S$ other than the last created formula in said collection $Q_S$ is equivalent to the next created quantified Boolean formula in said collection $Q_S$, then providing a response whose correctness is a logical consequence of the assertion that G is equivalent to the last created quantified Boolean formula in said collection $Q_S$.

7. The method of claim 2, wherein the system S is a modular system having subsystems referred to as modules, each module having common external and unique internal objects, and F is a set of clauses, further comprising the steps of choosing subformula A of F' to be a collection of existential quantifiers followed by a conjunction of clauses containing all clauses mentioning the variables corresponding to internal objects in one of said modules, with the variables corresponding to objects internal to said module existentially quantified in said collection of existential quantifiers, and other variables in said clauses being free.

8. The method of claim 2, wherein transforming said formula F into an equivalent formula F' comprises the steps of:

a. transforming F into an equivalent formula providing one or more subformulae;

b. choosing a subformula of said equivalent formula corresponding to one or more objects of said system S or parts of the constraints of said system S, or both;

c. choosing a collection of Boolean variables not occurring in said equivalent formula;

d. conjoining to said subformula of said equivalent formula definitions of said Boolean variables in terms of free variables in said subformula;

e. adding a collection of existential quantifiers to the beginning of said subformula, with said Boolean variables in said collection of variables existentially quantified in said collection of existential quantifiers; and f. letting F' be the resulting formula.

9. The methods of claim 2, wherein F is a set of clauses and transforming F and choosing the subformula A of F' representing part of said system S or of the specification of S, or both, are comprised of the steps of:

a. choosing a variable of F having a minimum number of neighbors;

b. creating a collection Z of variables consisting solely of said chosen variable;

c. repeatedly choosing a variable not in said collection Z that is a neighbor of any one of the variables in said collection Z so that the number of neighbors of said chosen variable, together with the neighbors of all variables in said collection Z, is as small as possible, and adding said chosen variable to said collection Z;

d. continuing said choosing of variables as long as a predetermined limit on the number of neighbors of variables in said collection Z is not exceeded, and there exists a variable not in said collection Z that is a neighbor of some variable in said collection Z;

e. creating a formula consisting of a conjunction of clauses containing all clauses mentioning variables in said collection Z, preceded by a collection of existential quantifiers, and such that all variables in clauses of said created formula are either in said collection Z or neighbors of variables in said collection Z;

f. mentioning variables in said collection Z as existentially quantified variables in said collection of existential quantifiers, with other variables in said created formula free;

g. transforming formula F into an equivalent formula F' having said created formula as a subformula; and h. letting A be said created formula.

10. The method of claim 2, wherein creating formula A', said formula A' being equivalent to subformula A of F', is comprised of the steps of:

a. creating quantified Boolean formulae in a collection $Q_A$ of quantified Boolean formulae;

b. for each created quantified Boolean formula in said collection $Q_A$, specifying a test for said formula, said test consisting of a test for satisfiability, or a test for falsifiability, or both;

c. performing said testing of quantified Boolean formulae in said collection $Q_A$;

d. permitting the omission of said testing of quantified Boolean formulae in said collection $Q_A$ when said testing is not necessary for the creation of said formula A';

e. storing the results of said testing in a storage medium of said computer system; and f. creating the quantified Boolean formula A' from the results of said testing.

11. The method of claim 2 wherein creating formula A', said formula A' being equivalent to subformula A of F' and said subformula A of F' has no free variables and consists of existential quantifiers followed by a subformula B of A, is comprised of the steps of:

a. testing whether said subformula B of A is satisfiable; and b. letting A' be "true," if said subformula B of A is satisfiable, and "false" otherwise.

12. The method of claim 2 wherein creating formula A', said formula A' being equivalent to subformula A of F' and said subformula A of F' has no free variables and consists of universal quantifiers followed by a subformula B of A, is comprised of the steps of:

a. testing whether said subformula B of A is a tautology; and b. letting A' be "true," if said subformula B of A is a tautology, and "false" otherwise.

13. The method of claim 2, wherein A is a subformula of F' consisting of all universal or all existential quantifiers followed by an unquantified subformula B.

14. The method of claim 6, wherein creating the formula A' is comprised of the steps:

a. if said logical relationship R between successively created formulae in said collection $Q_S$ of quantified Boolean formulae is that each formula in said collection $Q_S$ other than G is logically implied by the immediately previously created formula in said collection $Q_S$, and the polarity of A in F' is one, then creating A' so that A logically implies A';

b. if said logical relationship R between successively created formulae in said collection $Q_S$ is that each formula in said collection $Q_S$ other than G is logically implied by the immediately previously created formula in said collection $Q_S$, and the polarity of A in F' is negative one, then creating A' so that A' logically implies A;

c. if said logical relationship R between successively created formulae in said collection $Q_S$ is that each formula in said collection $Q_S$ other than G logically implies the immediately previously created formula in said collection $Q_S$, and the polarity of A in F' is one, then creating A' so that A' logically implies A;

d. if said logical relationship R between successively created formulae in said collection $Q_S$ is that each formula in said collection $Q_S$ other than G logically implies the immediately previously created formula in said collection $Q_S$, and the polarity of A in F' is negative one, then creating A' so that A logically implies A';

e. if said logical relationship R between successively created formulae in said collection $Q_S$ is that each formula in said collection $Q_S$ other than G implies, or is implied by, the next created formula in said collection $Q_S$, and the polarity of A in F' is zero, then creating A' so that A is logically equivalent to A'; and f. if said logical relationship R between successively created formulae in said collection $Q_S$ is that each formula in said collection $Q_S$ other than G is equivalent to the immediately previously created formula in said collection $Q_S$, then creating A' so that A is logically equivalent to A'.

15. The method of claim 10, wherein testing a quantified Boolean formula H for a logical property P, said logical property P being satisfiability or falsifiability, is comprised of:

a. expressing said quantified Boolean formula H as a Boolean combination of a collection $Q_H$ of subformulae of said quantified Boolean formula H, where subformulae in said collection $Q_H$ do not share free variables;

b. for each quantified Boolean formula in said collection $Q_H$, specifying a test to be applied to said quantified Boolean formula in said collection $Q_H$, said test consisting of a test for satisfiability or falsifiability or both, such that the results of said testing are sufficient to determine whether said quantified Boolean formula H has said logical property P;

c. performing said testing of said quantified Boolean formulae in said collection $Q_H$;

d. permitting the omission of said testing of quantified Boolean formulae in said collection $Q_H$ when said testing is not necessary for determining whether said quantified Boolean formula H has said property P;

e. storing the results of said testing in a storage medium of said computer system; and f. determining whether said quantified Boolean formula H has said property P from the results of said testing.

16. The method of claim 10, wherein creating a quantified Boolean formula A', said quantified Boolean formula A' being equivalent to subformula A of F', is comprised of the steps of:

a. choosing a collection of partial and total interpretations of the free variables of said subformula A of F' including all total interpretations of the free variables of A;

b. storing representations of the interpretations in said collection in a storage medium of said computer system;

c. making use of said representations, creating Boolean formulae in the collection $Q_A$ of quantified Boolean formulae (A relative to I) for interpretations I in said collection of partial and total interpretations;

d. for each created quantified Boolean formula in said collection $Q_A$, testing whether said quantified Boolean formula is satisfiable and whether said quantified Boolean formula is falsifiable;

e. omitting said storing of representations and said testing for interpretations I in said collection of interpretations if there is an interpretation J in said collection of interpretations such that J is a subset of I and such that testing of (A relative to J) provides a response that (A relative to J) is unsatisfiable or that (A relative to J) is not falsifiable;

f. for each interpretation I in said collection of interpretations such that testing provides a response that (A relative to I) is unsatisfiable, and for each interpretations I in said collection such that I is a total interpretation and (A relative to I) is unsatisfiable, creating a clause representing the negation of said interpretation I; and g. letting A'be the conjunction of said created clauses.

17. A computer system for verifying that a system satisfies certain predetermined constraints representing specifications of said system, wherein the system comprises a collection of interconnected objects such as found in an electric circuit, comprising:

a. a storage medium for storing a formula F representative of said system and its constraints;

b. a formula transformation module for transforming said formula F into an equivalent formula F' in a form that provides one or more subformulae;

c. a subformula identification module for choosing a desired subformula A of F' that can be simplified by making reference to said representation of the system, wherein said subformula represents one or more objects of the system or part of the system's constraints, or both;

d. a subformula replacement module for replacing A in F' by a formula A' having a specified logical relationship to A and having selected variables and quantifiers contained in A corresponding to one or more objects of said system or parts of said system's constraints removed, to obtain a formula F" having a second specified logical relationship to F; and e. means for processing collections of formulae having a specified logical relationship to F to provide a response indicative of whether said system satisfies certain predetermined constraints and signifying thereby whether said system S is capable of functioning according to said specifications.

* * * * *